US008399263B2

(12) United States Patent
Kiuchi et al.

(10) Patent No.: US 8,399,263 B2
(45) Date of Patent: Mar. 19, 2013

(54) METHOD FOR MEASURING EXPANSION/CONTRACTION, METHOD FOR PROCESSING SUBSTRATE, METHOD FOR PRODUCING DEVICE, APPARATUS FOR MEASURING EXPANSION/CONTRACTION, AND APPARATUS FOR PROCESSING SUBSTRATE

(75) Inventors: Tohru Kiuchi, Higashikurume (JP); Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 772 days.

(21) Appl. No.: 12/551,057

(22) Filed: Aug. 31, 2009

(65) Prior Publication Data

US 2010/0105153 A1 Apr. 29, 2010

Related U.S. Application Data

(60) Provisional application No. 61/193,002, filed on Oct. 21, 2008.

(51) Int. Cl.
*H01L 21/66* (2006.01)

(52) U.S. Cl. .................... 438/5; 438/7; 438/14; 438/16; 356/399; 257/E21.53

(58) Field of Classification Search .................. 438/5, 7, 438/14, 16, 22; 356/399–401; 257/E21.53
See application file for complete search history.

(56) References Cited

U.S. PATENT DOCUMENTS 4,007,866 A * 2/1977 Traise ............................ 226/31
4,565,442 A * 1/1986 Benker et al. .................. 355/68
6,342,735 B1 * 1/2002 Colelli et al. ................ 257/797
7,108,369 B2 9/2006 Newsome et al.
7,830,028 B2 * 11/2010 Li et al. ......................... 257/797
2005/0174377 A1 8/2005 Fujikura
2007/0035731 A1 * 2/2007 Hulsmann et al. ............ 356/401
2008/0254704 A1 * 10/2008 Hamada et al. ................. 445/24

FOREIGN PATENT DOCUMENTS

JP 4-194956 7/1992
JP 2007-1172 1/2007
WO WO 2006/036018 A1 4/2006

OTHER PUBLICATIONS

PCT/JP2009/066465 International Search Report dated Jan. 18, 2010.

* cited by examiner

*Primary Examiner* — Michael Trinh
(74) *Attorney, Agent, or Firm* — Finnegan, Henderson, Farabow, Garrett & Dunner, L.L.P.

(57) ABSTRACT

An expansion/contraction measuring apparatus includes a transport section which transports a flexible substrate along a surface of the substrate; a detecting section detecting first and second marks which are formed on the substrate while being separated from each other by a predetermined spacing distance in a transport direction of the substrate and which are moved, in accordance with the transport of the substrate, to first and second detection areas disposed on a transport route for the substrate respectively; a substrate length setting section which sets a length of the substrate along the transport route between the first and second detection areas to a reference length; and a deriving section which derives information about expansion/contraction of the substrate in relation to the transport direction based on a detection result of the first and second marks. Accordingly, the expansion/contraction state of an expandable/contractible substrate is measured highly accurately.

28 Claims, 14 Drawing Sheets

METHOD FOR MEASURING EXPANSION/CONTRACTION, METHOD FOR PROCESSING SUBSTRATE, METHOD FOR PRODUCING DEVICE, APPARATUS FOR MEASURING EXPANSION/CONTRACTION, AND APPARATUS FOR PROCESSING SUBSTRATE

CROSS-REFERENCES TO RELATED APPLICATIONS

This application claims the benefit of priority of U.S. Provisional Application No. 61/193,002 filed on Oct. 21, 2008, the entire disclosures of which are incorporated herein by reference.

BACKGROUND OF THE INVENTION

1. Field of the Invention

The present invention relates to a technique for measuring information about expansion/contraction of a substrate having expandability/contractibility.

2. Description of the Related Art

A display medium, which utilizes a liquid crystal or an organic EL, etc., is widely used as the display apparatus. For example, in the production of the organic EL display device, those known as the patterning method for patterning an electrode layer and an organic compound layer include a method in which an organic compound is vapor-deposited via a shadow mask, and a method in which an organic compound is coated by the ink-jet (see, for example, U.S. Pat. No. 7,108,369).

When the organic EL display device is produced, for example, a soluble material, which has been subjected to the coating, is dried by application of heat. For this reason, the substrate, which is subjected to the patterning, is thermally deformed in some cases. Therefore, in order to process the substrate highly accurately, it is important to control the length of the substrate highly precisely.

SUMMARY OF THE INVENTION

In view of the above, the present invention provides several aspects, an object of which is to provide a technique for expansion/contraction measurement, a technique for substrate processing, and a technique for producing a device, wherein it is possible to highly accurately determine an information about the expansion/contraction of a substrate having the expandability/contractibility.

According to a first aspect of the present invention, there is provided an expansion/contraction measuring method comprising: transporting an expandable/contractible substrate along a surface of the substrate; detecting first and second marks which are formed on the substrate while being separated from each other by a predetermined spacing distance in a transport direction of the substrate and which are moved, in accordance with the transport of the substrate, to first and second detection areas disposed on a transport route for the substrate respectively; setting a length of the substrate along the transport route between the first and second detection areas to a reference length: and deriving information about expansion/contraction of the substrate in relation to the transport direction based on a detection result of the first and second marks.

According to a second aspect of the present invention, there is provided an expansion/contraction measuring method for measuring expansion/contraction of a lengthy member which is transported while being hung on a rotary drum and which is processed by a processing device arranged to be opposite to the rotary drum, the method comprising: forming a plurality of marks on the lengthy member at a predetermined spacing distance in a longitudinal direction of the lengthy member; detecting simultaneously a first mark provided on a feed-on portion, of the lengthy member, which is to be fed onto the rotary drum and a second mark provided on a feed-out portion, of the lengthy member, which is fed out of the rotary drum; and obtaining information about the expansion/contraction of the lengthy member from relative positions of the detected first mark and the detected second mark.

According to a third aspect of the present invention, there is provided a substrate processing method comprising changing a length of a substrate in the transport direction based on the expansion/contraction information derived by using the expansion/contraction measuring method according to the first aspect of the present invention; and performing a predetermined process for the substrate.

According to a fourth aspect of the present invention, there is provided a device production method comprising performing a predetermined process for a substrate by using the substrate processing method according to the third aspect of the present invention; and processing the substrate, for which the predetermined process has been performed, based on a result of the predetermined process.

According to a fifth aspect of the present invention, there is provided an expansion/contraction measuring apparatus comprising a transport section which transports an expandable/contractible substrate along a surface of the substrate; a detecting section detecting first and second marks which are formed on the substrate while being separated from each other by a predetermined spacing distance in a transport direction of the substrate and which are moved, in accordance with the transport of the substrate, to first and second detection areas disposed on a transport route for the substrate respectively; a substrate length setting section which sets a length of the substrate along the transport route between the first and second detection areas to a reference length; and a deriving section which derives information about expansion/contraction of the substrate in relation to the transport direction based on a detection result of the first and second marks.

According to a sixth aspect of the present invention, there is provided a substrate processing apparatus comprising: the expansion/contraction measuring apparatus according to the fifth aspect of the present invention; and a processing section which changes a length of the substrate in the transport direction based on the expansion/contraction information derived by the expansion/contraction measuring apparatus and which performs a predetermined process for the substrate.

According to a seventh aspect of the present invention, there is provided a device production method comprising: performing a predetermined process for a substrate by using the substrate processing apparatus according to the sixth aspect of the present invention; and processing the substrate, for which the predetermined process has been performed, based on a result of the predetermined process.

According to the aspects of the present invention, it is possible to highly accurately determine the information about the expansion/contraction of the substrate having the expandability/contractibility.

DESCRIPTION OF THE PREFERRED EMBODIMENTS

Production Apparatus for Thin Film Transistor (TFT)

Figure 1:
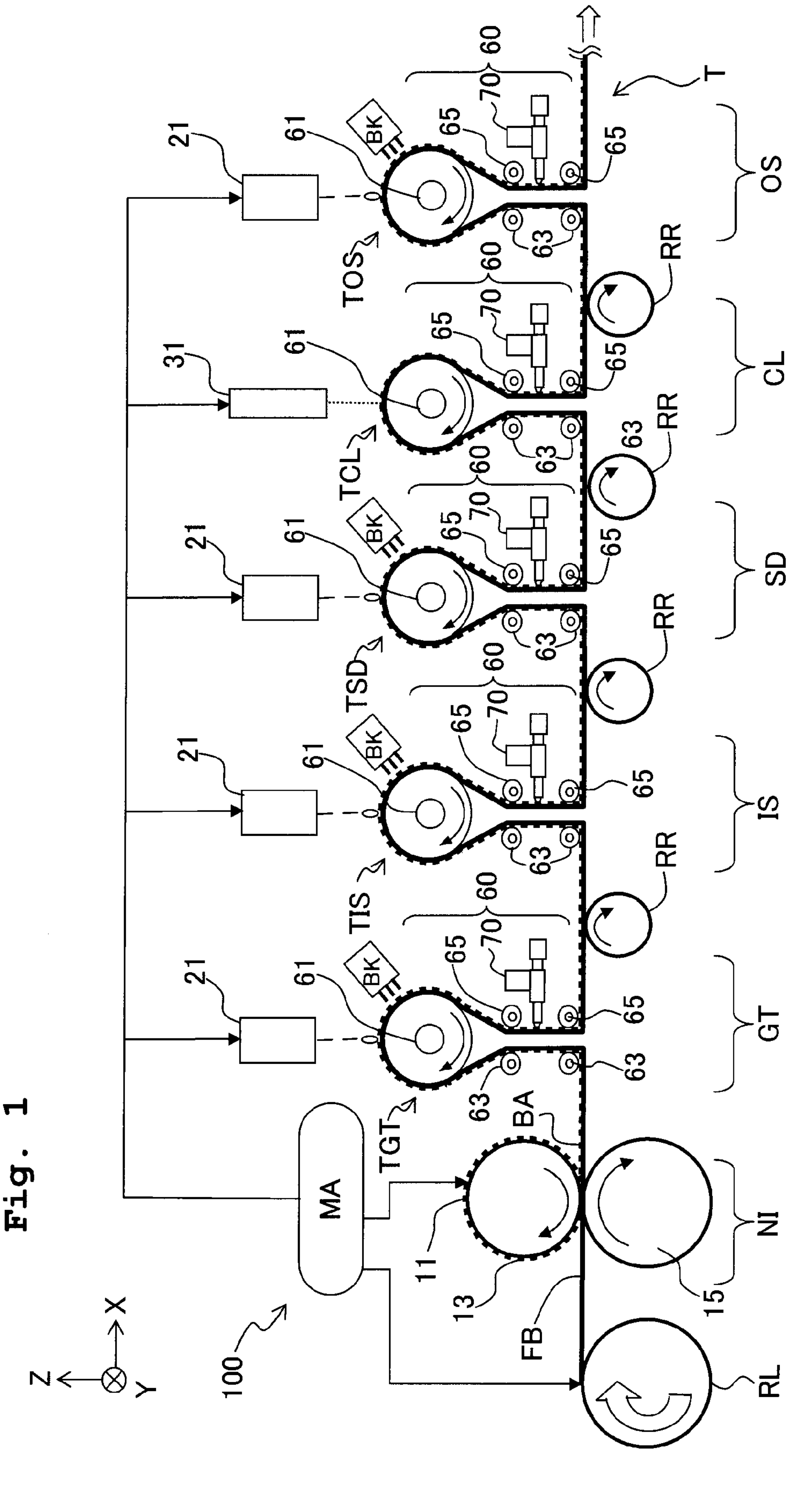
FIG. 1 schematically shows a construction of a production apparatus 100 as a substrate processing apparatus according to the present invention.

FIG. 1 schematically shows the construction of a production apparatus 100 for producing an organic EL display device by forming thin film transistors, etc. on a flexible lengthy sheet-shaped substrate FB (hereinafter referred to as "lengthy substrate FB"), as a substrate processing apparatus which processes the lengthy substrate FB. FIG. 1 shows only parts which relate to the production steps of producing the thin film transistors, and any production steps of producing a light-emitting layer (light emission layer) of the organic EL display device (and a light-emitting layer forming section as well) are omitted.

In the production of the organic EL display device, it is necessary to form the thin film transistor on the substrate for each of display pixels. In order to accurately form one or more organic compound layers (light-emitting element layers) including the light-emitting layer on pixel electrodes on the substrate, it is necessary to accurately form partition walls BA (see FIG. 3) in boundary areas of the pixel electrodes.

The production apparatus 100 transports the lengthy substrate FB on a transport route (transport path) T extending in a lateral direction. The production apparatus 100 includes a partition wall forming section, an electrode forming section, and a light-emitting layer forming section, in this order from the upstream to the downstream of the transport route T. In order to perform precise processes in the electrode forming section and the light-emitting layer forming section, it is necessary to correctly obtain expansion/contraction information and position information about the lengthy substrate FB. The lengthy substrate FB has, for example, a width of 1 m, a length of 100 m, and a thickness of not more than 1 mm. The lengthy substrate FB is wound in a roll form when the lengthy substrate FB is accommodated. The lengthy substrate FB can be formed of a flexible and light-transmitting material, and is formed, for example, of plastics such as PET (Polyethylene Terephthalate) and PES (Poly Ether Sulphone).

The production apparatus 100 has, on the upstream of the transport route T, a supply roller RL which is arranged in the production apparatus 100 and around which the lengthy substrate FB is wound in the roll form. By rotating the supply roller RL at a predetermined velocity, the lengthy substrate FB is fed toward the downstream of the transport route T. The production apparatus 100 is provided with transport rollers RR at a plurality of positions in the production apparatus 100. By rotating the transport rollers RR, the lengthy substrate FB is fed or transported on the transport route T in a state that the lengthy substrate FB has a predetermined tension. The transport rollers RR may be rubber rollers which sandwich and hold the lengthy substrate FB on or at both surfaces of the lengthy substrate FB. The transport direction in which the lengthy substrate FB is transported is the X direction. The longitudinal direction of the lengthy substrate FB which is transported corresponds to the X direction; the width direction of the lengthy substrate FB which is transported is the Y direction; and a direction perpendicular to the surface of the lengthy substrate FB which is transported is the Z direction.

The production apparatus 100 is provided with a main controller MA which performs the processing of various pieces of information and the control of respective sections or components of the production apparatus 100, including the velocity control, etc. of the supply roller RL and the transport rollers RR.

Partition Wall Forming Section

The lengthy substrate FB, which is fed from the supply roller RL, firstly enters the partition wall forming section NI which forms the partition walls BA on the lengthy substrate FB. In the partition wall forming section NI, the lengthy substrate FB is pressed by an imprint roller 11 to form the partition walls BA. The lengthy substrate FB is heated by a thermal transfer roller 15 to a temperature of not less than the transition point (for example, the glass transition point) thereof so that the formed partition walls BA retain the shapes thereby. In this way, in the partition wall forming section NI, a pattern shape, which is formed on the roller surface of the imprint roller 11, is accurately transferred to the lengthy substrate FB.

The roller surface of the imprint roller 11 is mirror-finished. A mold 13 for fine imprint, which is formed of a material including, for example, SiC and Ta, is attached to the roller surface. The mold 13 has a stamper portion for wiring the thin film transistors. In order to form alignment marks AM as reference marks (see FIG. 3) on one side or both sides in the Y direction as the widthwise direction of the lengthy substrate FB, the mold 13 has a stamper portion for the alignment marks AM. The stamper portion for forming the alignment marks AM is provided as a plurality of stamper portions for forming the alignment marks AM provided on the surface of the imprint roller 11 at predetermined intervals in the circumferential direction. Accordingly, by rotating the imprint roller 11, the plurality of alignment marks AM are formed on the lengthy substrate FB at equal spacing distances (intervals) in the longitudinal direction of the lengthy substrate FB.

Electrode Forming Section

It is allowable to use, as the thin film transistor (TFT), those based on the inorganic semiconductor and those based on the organic semiconductor. When the thin film transistor is constructed by using the organic semiconductor, the thin film transistor can be formed by utilizing the printing technique and the liquid droplet coating technique.

Those provided as the electrode forming section for the production apparatus 100 include a gate electrode forming section GT, an insulating layer forming section IS, a source/drain electrode forming section SD, a channel length forming section CL, and an organic semiconductor forming section OS which are formed in this order toward the downstream of the transport route T. In the electrode forming section, liquid droplet coating devices 21 are used except for the channel length forming section CL. The ink-jet system or the dispenser system can be adopted for the liquid droplet coating device 21. Those available as the ink-jet system include the charge control system, the pressure vibration system, the electromechanical conversion system, the electric heat exchange system, the electrostatic attraction system, etc. In the liquid droplet coating method, the material is scarcely wasted when the material is used. Further, a desired amount of the material can be appropriately arranged at a desired position.

Gate Electrode Forming Section

In the production apparatus 100, the gate electrode forming section GT is arranged in the downstream of the partition wall forming section NI. The gate electrode forming section GT is arranged such that a position-detecting device 60, a liquid droplet coating device 21, and a heat treatment device BK which are included in the gate electrode forming section GT are away from the transport route T in the Z direction, i.e. offset from the transport route T in the Z direction. The position-detecting device 60 is provided with a first optical detector 70, a main drum 61, outbound route subsidiary drums 63 disposed on the outbound route side, and inbound route subsidiary drums 65 disposed on the inbound route side. The main drum 61 is also arranged at a position away from the transport route T in the Z direction; and the liquid droplet coating device 21 is arranged to be on the opposite side of the transport route T with respect to the main drum 61.

The first optical detector 70 detects the alignment marks AM (see FIGS. 3 and 4) formed on the lengthy substrate FB. The main drum 61, which serves as the support member, is rotatable about the axis perpendicular to the transport direction of the lengthy substrate FB. The lengthy substrate FB is allowed to hang on or travel along the main drum 61, and thus the lengthy substrate FB is folded back and transported. Coating areas for being coated with a metal ink by the liquid droplet coating device 21 are formed on the lengthy substrate FB folded back by the main drum 61. The outbound route subsidiary drums 63 are auxiliary support members for directing, in the +Z direction, the lengthy substrate FB transported in the X direction. The inbound route subsidiary drums 65 are auxiliary support members for directing, in the X direction, the lengthy substrate FB transported in the −Z direction via the main drum 61. As described above, the lengthy substrate FB, which is transported on the transport route T in the X direction, is moved toward the liquid droplet coating device 21 by the main drum 61, the outbound route subsidiary drums 63 and inbound route subsidiary drums 65; and after the lengthy substrate FB passes through the liquid coating device 21, the heat treatment device BK and the position-detecting device 60, the advancing (moving or transporting) direction of the lengthy substrate FB is adjusted such that the lengthy substrate FB is retuned again on the transport route T. Namely, in the gate electrode forming section GT, a sub transport route TGT is defined by the main drum 61, the outbound route subsidiary drums 63 and inbound route subsidiary drums 65; and the liquid droplet coating device 21, the heat treatment device BK and the position-detecting device 60 are arranged in this order from the upstream to the downstream of this sub transport route TGT. Further, the lengthy substrate FB is allowed to hang on or travel along the circumference (or a part of the circumference) of the main drum 61 to be thereby supported by the main drum 61 with tension while the liquid droplets from the liquid droplet coating device 21 are accumulated on the lengthy substrate.

The position-detecting device 60 is capable of detecting the deviation in the Y direction of the lengthy substrate FB and the expansion/contraction amount of the lengthy substrate FB based on a detection result obtained by the first optical detector 70. The detection result is supplied to the main controller MA. The position-detecting device 60 will be described in detail later on.

The liquid droplet coating device 21, which is arranged in the gate electrode forming section GT, coats the metal ink for the gate electrode on the lengthy substrate FB. A timing, at which the metal ink is to be coated or applied, is instructed to the liquid droplet coating device 21 by the main controller MA based on the detection result supplied from the position-detecting device 60. The metal ink, coated on the lengthy substrate FB, undergoes hot air current, radiation heat, etc. provided, for example, by the far infrared radiation or the like by the heat treatment device BK, and thus the metal ink is dried or sintered (baked). In accordance with the process as described above, the gate electrode is formed.

Insulating Layer Forming Section

Subsequently, the lengthy substrate FB is transported from the gate electrode forming section GT to the insulating layer forming section IS. The insulating layer forming section IS is also arranged such that a position-detecting device 60, a liquid droplet coating device 21, and a heat treatment device BK which are included in the insulating layer forming section IS are each offset from the transport route T in the Z direction. Also in the insulating layer forming section IS, the main drum 61, the outbound route subsidiary drums 63 and inbound route subsidiary drums 65 are provided; and the lengthy substrate FB is moved toward the liquid droplet coating device 21 by the main drum 61, the outbound route subsidiary drums 63 and inbound route subsidiary drums 65. After the lengthy substrate FB passes through the liquid coating device 21, the heat treatment device BK and the position-detecting device 60, the advancing direction of the lengthy substrate FB is adjusted such that the lengthy substrate FB is retuned again on the transport route T. Namely, in the insulating layer forming section IS, a sub transport route TIS is defined by the main drum 61, the outbound route subsidiary drums 63 and inbound route subsidiary drums 65. The lengthy substrate FB is allowed to hang on or travel along the circumference (or a part of the circumference) of the main drum 61 to be thereby supported by the main drum 61 with tension while the liquid droplets from the liquid droplet coating device 21 are accumulated on the lengthy substrate. The position-detecting device 60 is same as or equivalent to the position-detecting device 60 of the gate electrode forming section GT, and will be described in detail later on. The liquid droplet coating device 21 for the insulating layer coats, on the lengthy substrate FB, an electrically insulative ink based on polyimide resin or urethane resin, instead of coating the metal ink. A timing, at which the electrically insulative ink is to be applied or coated, is instructed to the liquid droplet coating device 21 by the main controller MA based on a detection result supplied from the position-detecting device 60. The electrically insulative ink is dried and cured by the heat treatment device BK. In accordance with the process as described above, the insulating layer of the gate electrode is formed.

Source/Drain Electrode Forming Section

Subsequently, the lengthy substrate FB is transported from the insulating layer forming section IS to the source/drain electrode forming section SD. The source/drain electrode forming section SD is also arranged such that a position-detecting device 60, a liquid droplet coating device 21, and a heat treatment device BK which are included in the source/drain forming section DS are each offset from the transport route T in the Z direction. Also in the source/drain electrode forming section SD, the main drum 61, the outbound route subsidiary drums 63 and inbound route subsidiary drums 65 are provided; and the lengthy substrate FB is moved toward the liquid droplet coating device 21 by the main drum 61, the outbound route subsidiary drums 63 and inbound route subsidiary drums 65. After the lengthy substrate FB passes through the liquid coating device 21, the heat treatment device BK and the position-detecting device 60, the advancing direction of the lengthy substrate FB is adjusted such that the lengthy substrate FB is retuned again on the transport route T. Namely, in the source/drain electrode forming section SD, a sub transport route TDS is defined by the main drum 61, the outbound route subsidiary drums 63 and the inbound route subsidiary drums 65. The lengthy substrate FB is allowed to hang on or travel along the circumference (or a part of the circumference) of the main drum 61 to be thereby supported by the main drum 61 with tension while the liquid droplets from the liquid droplet coating device 21 are accumulated on the lengthy substrate. The liquid droplet coating device 21 for the source/drain coats a metal ink in the same manner as in the formation of the gate electrode. A timing, at which the metal ink is to be coated, is instructed to the liquid droplet coating device 21 by the main controller MA based on a detection result supplied from the position-detecting device 60. The metal ink is dried and cured by the heat treatment device BK. In accordance with the process as described above, the source/drain electrode is formed.

Source and drain electrodes are formed in a state in which they are in conduction in the source/drain electrode forming section SD. The spacing distance between the source electrode and the drain electrode, i.e., the spacing distance corresponding to the channel length is a thin width of about 3 μm to 30 μm. Therefore, it is difficult to form the channel length having the correct width merely by coating the metal ink from the liquid droplet coating device 21. Therefore, an electrode, in which the source electrode and the drain electrode are connected to each other, is formed in the source/drain electrode forming section SD.

Channel Length Forming Section

The channel length forming section CL cuts the electrode to form the channel length, because the electrode, in which the source electrode and the drain electrode are connected to each other, is formed in the source/drain electrode forming section SD. The lengthy substrate FB is transported from the source/drain electrode forming section SD to the channel length forming section CL. The channel length forming section CL is arranged such that a position-detecting device 60 and a cutting device 31 which are included in the channel length forming section CL are each offset from the transport route T in the Z direction. Also in the channel length forming section CL, the main drum 61, the outbound route subsidiary drums 63 and inbound route subsidiary drums 65 are provided; and the lengthy substrate FB is moved toward the cutting device 31 by the main drum 61, the outbound route subsidiary drums 63 and inbound route subsidiary drums 65. After the lengthy substrate FB passes through the cutting device 31 and the position-detecting device 60, the advancing direction of the lengthy substrate FB is adjusted such that the lengthy substrate FB is retuned again on the transport route T. Namely, in the channel length forming section CL, a sub transport route TCL is defined by the main drum 61, the outbound route subsidiary drums 63 and inbound route subsidiary drums 65. The position-detecting device 60 is same as or equivalent to the position-detecting device 60 of the gate electrode forming section GT, and will be described in detail later on. The cutting device 31 uses, for example, a femtosecond laser, and cuts the source electrode and the drain electrode which are connected to each other. A femtosecond laser, which uses a titanium sapphire laser, radiates a laser beam LL having a wavelength of 760 nm with pulses of 10 KHz to 40 KHz. By rotating a galvano-mirror (not shown) arranged in the optical path for the laser beam LL, the radiation position of the laser beam LL is changed. Namely, the lengthy substrate FB is allowed to hang on or travel along the circumference (or a part of the circumference) of the main drum 61 to be thereby supported by the main drum 61 with tension while the source electrode and the drain electrode are separated by the cutting device 31.

The cutting device 31 is capable of performing a cutting processing in the submicron order. With this, the source electrode and the drain electrode are separated from each other highly accurately. Other than the femtosecond laser, it is also possible to use, for example, a carbon dioxide gas laser or a green laser. The cutting may be mechanically performed by using a dicing saw, etc., instead of using the laser.

Organic Semiconductor Forming Section

Subsequently, the lengthy substrate FB is transported from the channel length forming section CL to the organic semiconductor forming section OS. The organic semiconductor forming section OS is also arranged such that a position-detecting device 60, a liquid droplet coating device 21, and a heat treatment device BK which are included in the organic semiconductor forming section OS are each offset from the transport route T in the Z direction. Also in the organic semiconductor forming section OS, the main drum 61, the outbound route subsidiary drums 63 and inbound route subsidiary drums 65 are provided; and the lengthy substrate FB is moved toward the liquid droplet coating device 21 by the main drum 61, the outbound route subsidiary drums 63 and inbound route subsidiary drums 65. After the lengthy substrate FB passes through the liquid coating device 21, the heat treatment device BK and the position-detecting device 60, the advancing direction of the lengthy substrate FB is adjusted such that the lengthy substrate FB is retuned again on the transport route T. Namely, in the organic semiconductor forming section OS, a sub transport route TOS is defined by the main drum 61, the outbound route subsidiary drums 63 and the inbound route subsidiary drums 65. The liquid droplet coating device 21 for the organic semiconductor coats an organic semiconductor ink on the channel length between the source electrode and the drain electrode. A timing, at which the organic semiconductor ink is to be coated, is instructed to the liquid droplet coating device 21 by the main controller MA based on a detection result supplied from the position-detecting device 60. The organic semiconductor ink is dried and cured by the heat treatment device BK. In accordance with the process as described above, the organic semiconductor is formed.

The main controller MA receives the detection results of the alignment marks AM (the expansion/contraction information, etc. as described later on) from the plurality of position-detecting devices 60 to control the ink coating positions and the ink coating timings for the liquid droplet coating devices 21 and the cutting position and the cutting timing for the cutting device 31.

Position-Detecting Device

Figure 2:
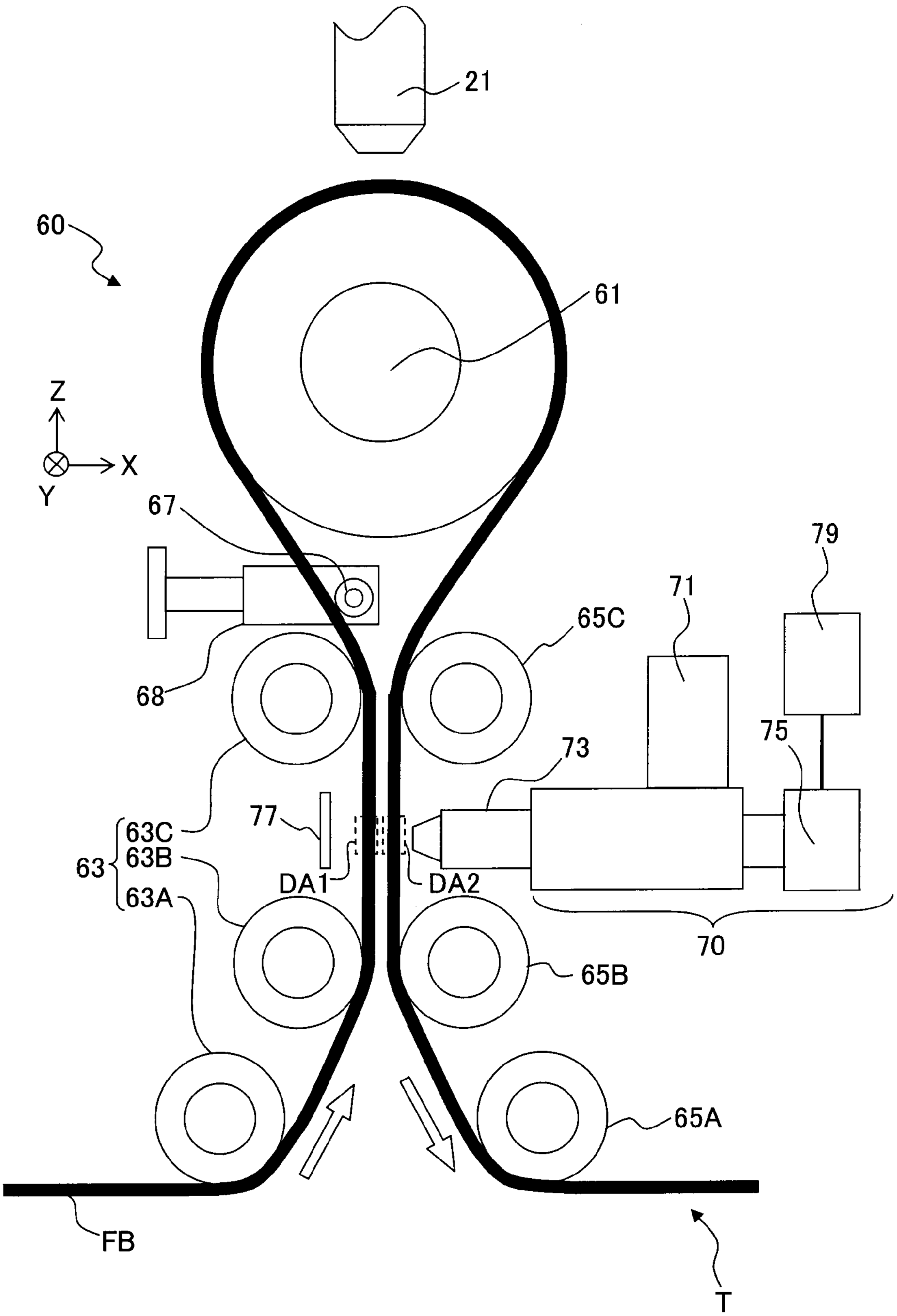
FIG. 2 shows a schematic side view of a construction of a position-detecting device 60 as an expansion/contraction measuring apparatus of the present invention.

FIG. 2 shows a schematic side view of the construction of the position-detecting device 60 as the expansion/contraction measuring apparatus of the present invention.

The main drum 61 of the position-detecting device 60 is constructed so that the main drum 61 is rotated by an unillustrated stepping motor or a servo motor. The main drum 61 is a drum having a diameter larger than that of the outbound route subsidiary drum 63 or the inbound route subsidiary drum 65. In order to perform the process including, for example, the application or coating of the liquid droplets onto the lengthy substrate FB disposed on the main drum 61, it is necessary to mitigate, to some extent, the curvature of the lengthy substrate FB in the processing area. Corresponding to this, it is preferable that the diameter of the main drum 61 is large. The circumference of the main drum 61 is set, for example, to be a length which is an integral multiple of the interval or spacing distance (pitch) between the plurality of alignment marks AM.

As shown in FIG. 2, the outbound route subsidiary drum 63 includes, for example, three drums, i.e., a first outbound route subsidiary drum 63A, a second outbound route subsidiary drum 63B, and a third outbound route subsidiary drum 63C so as to direct the lengthy substrate FB, which is transported in the X direction, in the Z direction. The number of drums constructing the outbound route subsidiary drum 63 is not limited.

As shown in FIG. 2, the inbound route subsidiary drum 65 includes, for example, three drums, i.e., a first inbound route subsidiary drum 65A, a second inbound route subsidiary drum 65B, and a third inbound route subsidiary drum 65C so as to direct the lengthy substrate FB, which is transported in the Z direction, in the X direction. The number of drums constructing the inbound route subsidiary drum 65 is not limited.

The third outbound route subsidiary drum 63C and the third inbound route subsidiary drum 65C are arranged in the vicinity of the main drum 61 so that the lengthy substrate FB is sufficiently brought in contact with the main drum 61. The third outbound route subsidiary drum 63C is movable in the Y direction which is the axial direction of the drum. The lengthy substrate FB, which is transported in the X direction, is inclined by the first outbound route subsidiary drum 63A by a predetermined angle (for example, 45 degrees) with respect to the Z direction; and the lengthy substrate FB, which is inclined by the predetermined angle, is directed in the Z direction by the second outbound route subsidiary drum 63B. The lengthy substrate FB, which is transported in the Z direction, is inclined by the second inbound route subsidiary drum 65B by a predetermined angle (for example, 45 degrees) with respect to the Z direction; and the lengthy substrate FB, which is inclined by the predetermined angle, is transported by the first inbound route subsidiary drum 65A while being directed in the X direction.

The second outbound route subsidiary drum 63B and the third outbound route subsidiary drum 63C are arranged at the same position in relation to the X direction; and the second inbound route subsidiary drum 65B and the third inbound route subsidiary drum 65C are also arranged at the same position in relation to the X direction. Therefore, a pre-folding portion of the lengthy substrate FB (i.e., a portion not folded back and transported by the main drum 61) which is transported by the second outbound route subsidiary drum 63B and the third outbound route subsidiary drum 63C and a post-folding portion of the lengthy substrate FB (i.e., a portion folded back and transported by the main drum 61) which is transported by the second inbound route subsidiary drum 65B and the third inbound route subsidiary drum 65C are transported closely and in parallel to each other. For example, the spacing distance between the pre-folding portion of the lengthy substrate FB and the post-folding portion of the lengthy substrate FB is about 0.1 mm to 3 mm. In order to retain the pre-folding portion of the lengthy substrate FB and the post-folding portion of the lengthy substrate FB at the narrow spacing distance, it is also allowable to provide a mechanism for injecting the air into the space between the portions of the lengthy substrate FB to generate the positive pressure.

A tension roller 67 is arranged between the main drum 61 and the third outbound route subsidiary drum 63C. The tension roller 67 is provided with a linear driving section 68. By moving the linear driving section 68 in the X direction, it is possible to change the tension applied from the tension roller 67 to the lengthy substrate FB.

Construction of First Optical Detector

The first optical detector 70 is constructed to include an illumination section 71, an objective lens section 73, and a light-receiving section (image pickup section) 75. The illumination section 71 has a light source device capable of performing a short period illumination including, for example, a strobe device and a semiconductor light source such as LED or the like. The illumination section 71 is capable of performing the pulse light emission of about 10 μseconds to 1 millisecond. The objective lens section 73 is a double-focus optical system or an optical system having a deep depth of focus capable of focusing on the lengthy substrate FB disposed on the upstream side (i.e., on the outbound route side) and the lengthy substrate FB disposed on the downstream side (i.e., on the inbound route side) with respect to the main drum 61. The objective lens section 73 defines a first detection area DA1 for the pre-folding portion of the lengthy substrate FB not folded back by the main drum 61 and a second detection area DA2 for the post-folding portion of the lengthy substrate FB folded back by the main drum 61. The first detection area DA1 and the second detection area DA2 are defined at approximately equal distances from the main drum 61, i.e., at approximately equal distances from the central axis (corresponding to the axis of rotation) of the main drum 61. In this way, the length, which is provided in the transport direction of the lengthy substrate FB between the first detection area DA1 and the second detection area DA2, is set to be a predetermined reference length by the main drum 61 and the objective lens section 73. The reference length is set, for example, to be equal to an integral multiple of the length of the outer circumferential surface around the axis of rotation of the main drum 61, i.e., an integral multiple of the circumference of the main drum 61. By setting the reference length in this manner, it is possible to synchronize the detection timing by the first optical detector 70 with the velocity of rotation of the main drum 61. The reference length is set, for example, to be a length which is an integral multiple of the spacing distance between the alignment marks AM along the surface of the lengthy substrate FB. The length (detection length), of each of the first detection area DA1 and the second detection area DA2, in the passing direction of the lengthy substrate FB (in the Z direction) is greater than the spacing distance (pitch) between the alignment marks AM. Consequently, at any detection timing, at least one alignment mark AM always exists in each of the first and second detection areas DA1 and DA2. In this embodiment, the detection length of each of the first and second detection areas DA1 and DA2 has a length not less than twice the spacing distance of the alignment marks AM (see FIG. 3B).

The light-receiving section 75 has, for example, a CCD sensor or a CMOS sensor. The light-receiving section 75 is capable of simultaneously photographing or imaging the alignment mark AM (first mark) moved into the first detection area DA1 and the alignment mark AM (second mark) moved into the second detection area DA2. The light-receiving section 75 photographs or images the alignment marks AM as the first mark and the second mark based on the illumination light (illumination light beam) radiated by the illumination section 71 and reflected by the alignment marks AM. It is possible to arrange a reflecting plate 77 on the side opposite to the objective lens section 73 with respect to the lengthy substrate FB. In this case, the light-receiving section 75 can image the alignment marks AM based on the illumination light via the reflecting plate 77. In this case, since the lengthy substrate FB is light-transmitting, the light from the second mark passes (is transmitted) through the post-folding portion of the lengthy substrate FB, and arrives at the light-receiving section 75.

The first optical detector 70 uses the illumination section 71 capable of performing the short period illumination. Accordingly, even when the lengthy substrate FB is transported, for example, at a velocity of about 0.1 m/second to 1.0 m/second, the light-receiving section 75 can image the alignment mark AM as if the alignment mark AM instantaneously stands substantially still.

The imaging or photographing result obtained by the light-receiving section 75 is supplied to an image processing section 79. The image processing section 79 derives expansion/contraction information indicating the expansion/contraction state of the lengthy substrate FB with respect to the reference length and the deviation information indicating, for example, the positional deviation of the lengthy substrate FB in the Y direction, based on the image (image information) of the alignment marks AM imaged by the light-receiving section 75. The image processing section 79 continuously observes the plurality of alignment marks AM successively moved into the first detection area DA1, and thus the image processing section 79 can also derive velocity information indicating the actual transport velocity of the lengthy substrate FB. The expansion/contraction information or the information about the expansion/contraction, the deviation information or the information about the deviation, and the velocity information or the information about the velocity as described above may be derived by the main controller MA based on the image information or the information about the image photographed or imaged by the light-receiving section 75.

Various shapes can be applied to the alignment marks AM. A plurality of types of alignment marks are described below by way of example.

Photographed Image of First Alignment Mark

Figure 3A:
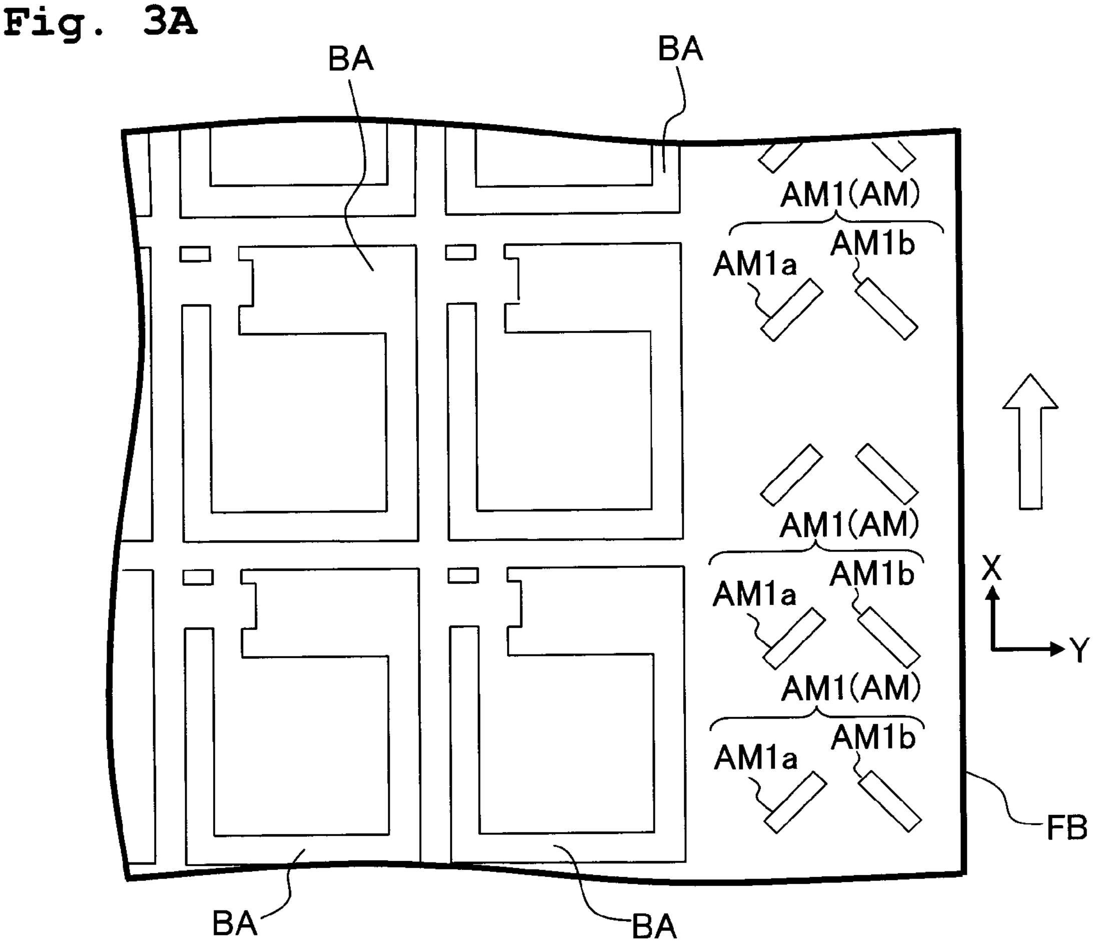
FIG. 3A shows a plan view of first alignment marks AM1 formed on a lengthy substrate (elongated substrate) FB.
Figure 3B:
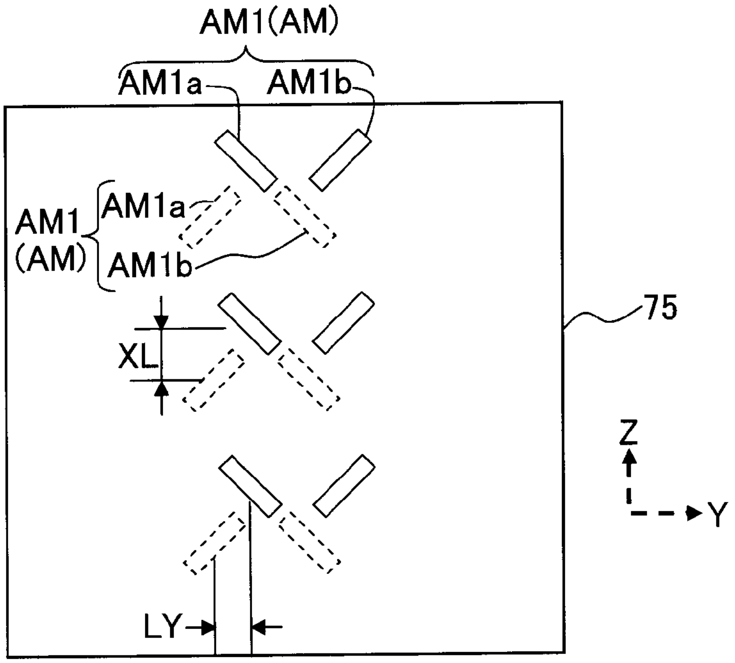
FIG. 3B shows an example of an image photographed or imaged by a light-receiving section 75 of a first optical detector 70.

FIG. 3A shows a plan view of the partition walls BA for the organic EL display device formed on the lengthy substrate FB by the imprint roller 11 shown in FIG. 1 and the first alignment marks AM1 as the alignment marks AM. FIG. 3B shows an example of an image photographed by the light-receiving section 75 of the first optical detector 70. The upward direction in FIG. 3B corresponds to the positive direction of the Z axis, for the following reason. That is, as shown in FIG. 2, the first detection area DA1 and the second detection area DA2 are arranged in the YZ plane.

As shown in FIG. 3A, the first alignment marks AM1 are formed at an end portion in the width direction (the Y direction) of the lengthy substrate FB. The first alignment mark AM1 is located at a position separated by a predetermined distance from the partition wall BA. The first alignment mark AM1 is formed of a linear mark AMla which extends in a direction of +45 degrees with respect to the longitudinal direction of the lengthy substrate, namely the transport direction (X direction) indicated by an arrow and a linear mark AMlb which extends in a direction of −45 degrees with respect to the transport direction (X direction). A plurality of the first alignment marks AM1 are formed at equal intervals in the longitudinal direction (transport direction) of the lengthy substrate FB; and adjacent first alignment marks AM1 are arranged, for example, at a pitch of 50 μm. However, the lengthy substrate FB is expanded/contracted due to the influence exerted, for example, by the heat treatment device BK shown in FIG. 1. The pitch between the adjacent first alignment marks AM1 is fluctuated depending on the expansion/contraction.

FIG. 3B shows an example of an image of a case in which the light-receiving section 75 simultaneously images or photographs the first alignment marks AM1 on the outbound route disposed in the first detection area DA1 and the first alignment marks AM1 on the inbound route disposed in the second detection area DA1, wherein the first alignment marks AM1 on the outbound route are depicted by dotted lines, and the first alignment marks AM1 on the inbound route are depicted by solid lines. In this case, the reference length of the lengthy substrate FB is set to an integral multiple of the spacing distance (pitch) between two of first alignment marks AM1; and the detection length of each of the first and second detection areas DA1 and DA2 is set as described above. Therefore, at least one first alignment mark AM1 simultaneously exists in each of the first detection area DA1 and the second detection area DA2.

If the lengthy substrate FB is not expanded/contracted, the first optical detector 70 images the first alignment marks AM1 at a timing at which the first alignment marks AM1 on the outbound route depicted by the dotted lines and the first alignment marks AM1 on the inbound route depicted by the solid lines are originally overlapped with each other. However, in some cases, as shown in FIG. 3B, the first alignment marks AM1 on the outbound route and the first alignment marks AM1 on the inbound route are detected as being deviated by a distance XL in the transport direction and by a distance YL in the Y direction. The image processing section 79 derives the expansion/contraction information of the lengthy substrate FB with respect to the reference length in the transport direction based on the first alignment marks AM1 separated from each other by the distance XL, and the image processing section 79 derives relative deviation information of the lengthy substrate FB in the Y direction based on the first alignment marks AM1 separated from each other by the distance YL. That is, the image processing section 79 derives the expansion/contraction information and the deviation information of the lengthy substrate FB based on the relative position information about the first alignment marks AM1 on the outbound route and the inbound route detected based on the information about the image photographed by the light-receiving section 75. The deviation information in the Y direction of the lengthy substrate FB includes information about the inclinations of the lengthy substrate FB on the upstream side and the downstream side.

When the lengthy substrate FB is contracted or shrunk in the transport direction, then, for example, the tension roller 67 pulls the lengthy substrate FB to allow the lengthy substrate FB to have the tensile stress thereby, and the length thereof can be finely corrected. The length can be also corrected such that the tensile stress is applied to the lengthy substrate FB by moving the third outbound route subsidiary drum 63C or the third inbound route subsidiary drum 65C in the X direction, instead of the tension roller 67. In a case that the lengthy substrate FB is deviated in the Y direction, the inclination of the lengthy substrate FB (inclination, with respect to the Z direction, of a line connecting the center of an upstream portion, of the lengthy substrate FB, with respect to the main drum 61 and the center of a downstream portion, of the lengthy substrate FB, with respect to the main drum 61) can be adjusted, for example, by moving the third outbound route subsidiary drum 63C in the Y direction.

Photographed Image of Second Alignment Mark

Figure 4A:
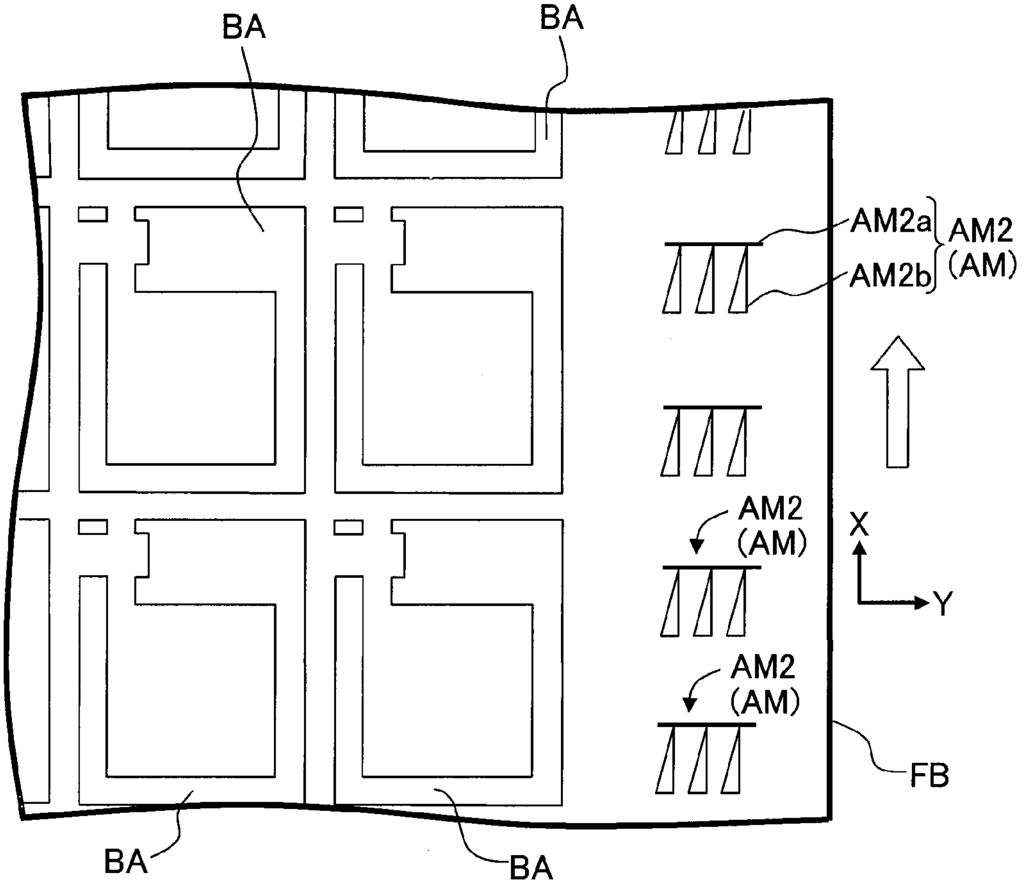
FIG. 4A shows a plan view of a lengthy substrate FB depicted with another second alignment marks AM2 different from the first alignment marks AM1.
Figure 4B:
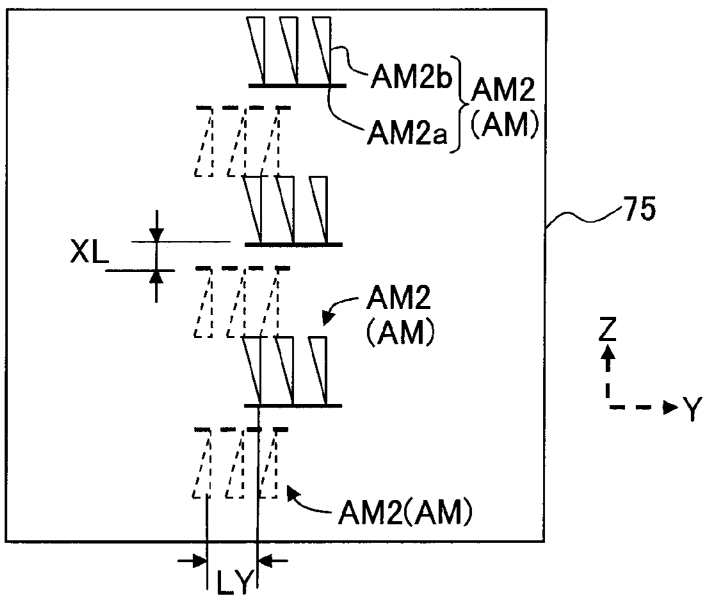
FIG. 4B shows an example of an image photographed by the light-receiving section 75 of the first optical detector 70.

FIG. 4A shows a plan view of the lengthy substrate FB to depict second alignment marks AM2 as another alignment marks AM different from those shown in FIG. 3. FIG. 4B shows an example of an image photographed (imaged) by the light-receiving section 75 of the first optical detector 70. The upward direction in FIG. 4B corresponds to the positive direction of the Z axis. This is the same reason as that explained in relation to FIG. 3B.

As shown in FIG. 4A, the second alignment mark AM2 is formed of a linear mark AM2*a* which extends in the Y direction, and three triangular marks AM2*b* which have apexes positioned on the linear mark AM2*a*. A plurality of pieces of the second alignment mark AM2 are also formed at equal intervals in the transport direction. However, the lengthy substrate FB is expanded/contracted due to the influence exerted, for example, by the heat treatment device BK shown in FIG. 1, and the pitch between the adjacent second alignment marks AM2 is fluctuated depending on the expansion/contraction.

FIG. 4B shows an example of an image of a case in which the light-receiving section 75 simultaneously photographs or images the second alignment marks AM2 disposed in the first detection area DA1 and the second alignment marks AM2 disposed in the second detection area DA2, wherein the second alignment marks AM2 disposed on the outbound route are depicted by dotted lines, and the second alignment marks AM2 disposed on the inbound route are depicted by solid lines.

As shown in FIG. 4B, the second alignment mark AM2 on the outbound route (linear mark AM2*a*) and the second alignment mark AM2 on the inbound route (linear mark AM2*a*) are deviated from each other by the distance XL in the transport direction. The image processing section 79 derives the expansion/contraction information of the lengthy substrate FB with respect to the reference length in the transport direction based on the second alignment marks AM2 separated from each other by the distance XL. The second alignment mark AM2 on the outbound route (triangular mark AM2*b*) and the second alignment mark AM2 on the inbound route (triangular mark AM2*b*) are deviated from each other by the distance YL in the Y direction. The image processing section 79 derives the relative deviation information in the Y direction of the lengthy substrate FB based on the second alignment marks AM2 separated from each other by the distance YL. That is, the expansion/contraction information and the deviation information of the lengthy substrate FB are derived by the image processing section 79 based on the relative position information about the second alignment marks AM2 disposed on the outbound route and the inbound route detected based on the information of the image photographed by the light-receiving section 75.

Modification of Optical Detector

Figure 5A:
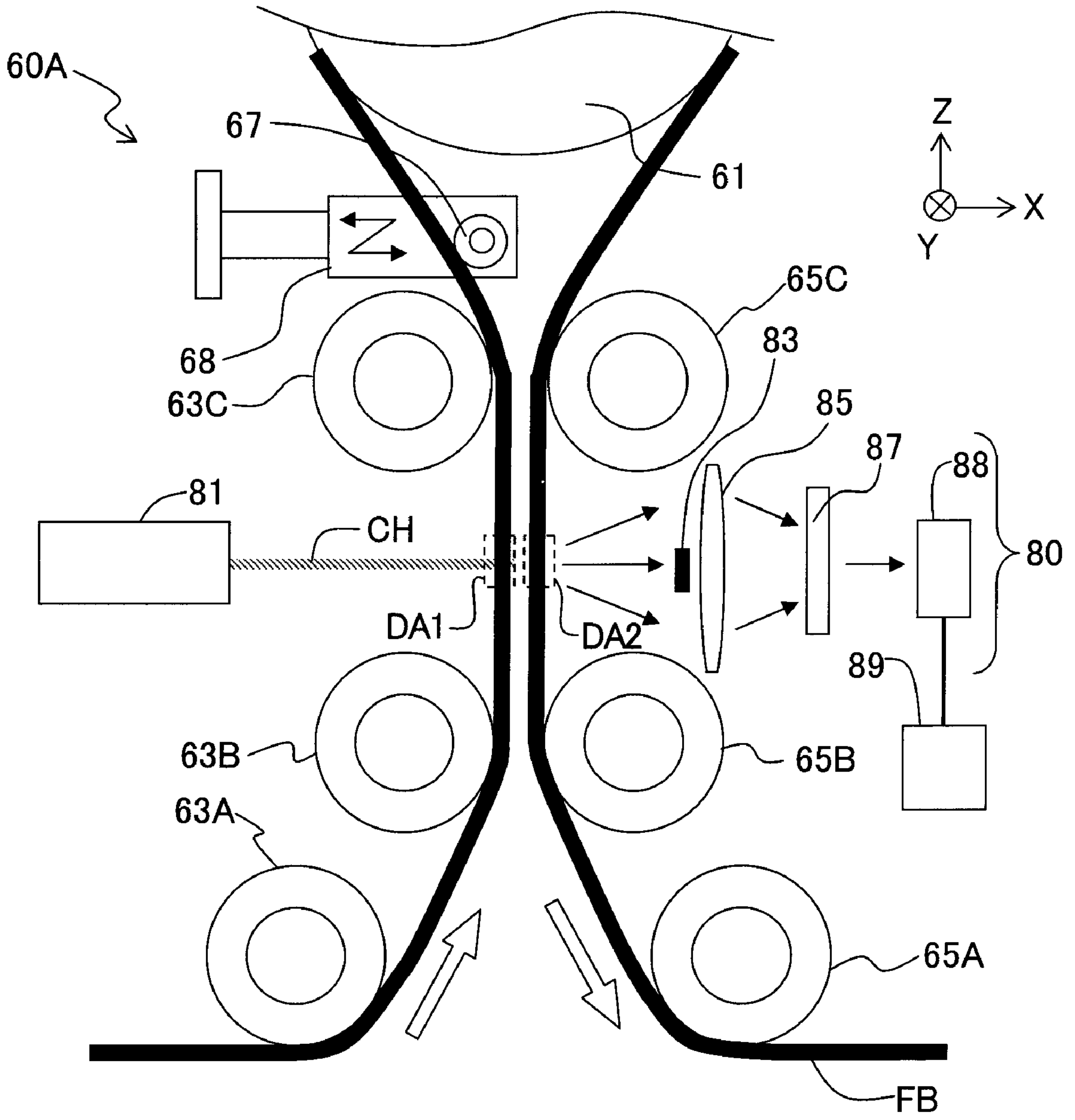
FIG. 5A shows a schematic side view of a position-detecting device 60A using a second optical detector 80.

FIG. 5A shows a schematic side view of the construction of a position-detecting device 60A using a second optical detector 80.

The second optical detector 80 shown in FIG. 5A includes a second illumination section 81, a light shielding plate 83, a light-collecting lens section 85, a reference grating plate 87, and a second light-receiving section 88.

Figure 5B:
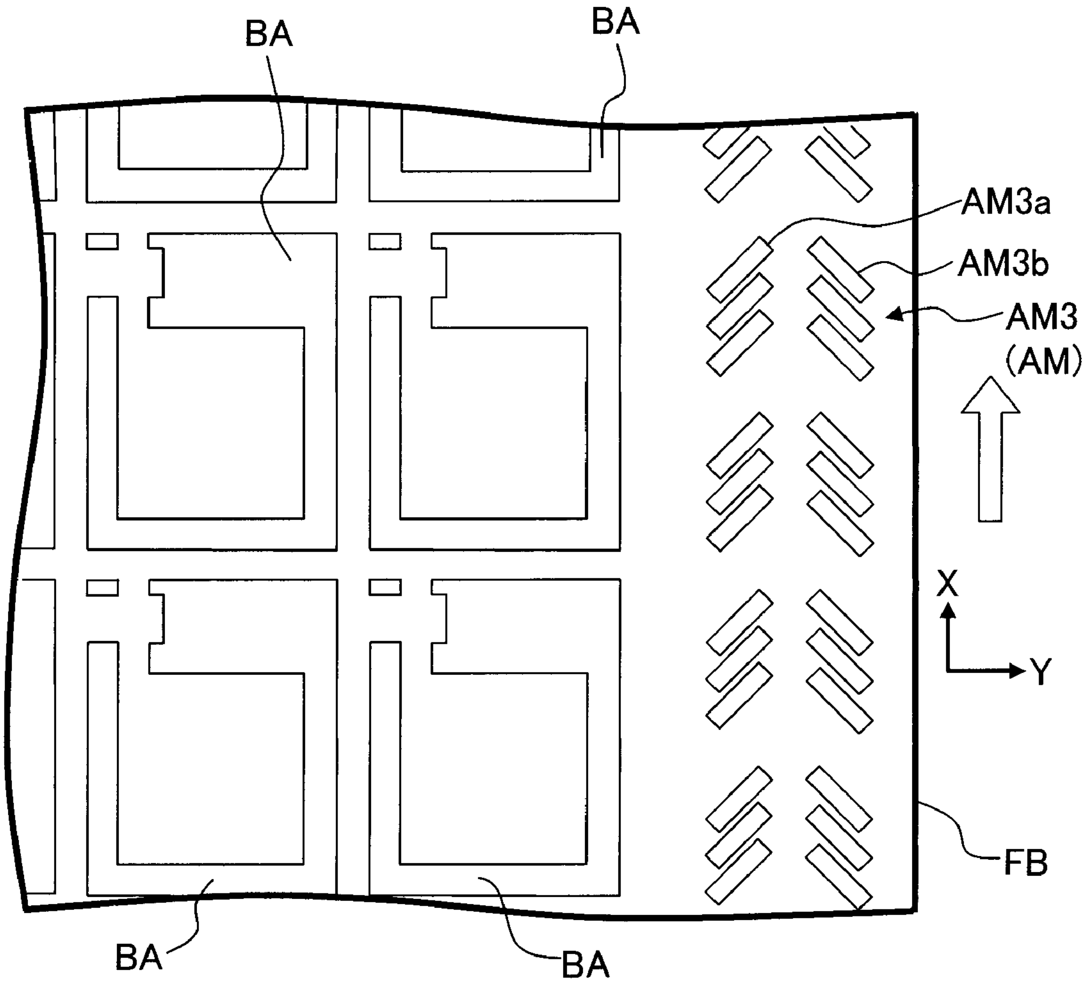
FIG. 5B shows a plan view of third alignment marks AM3 as grating-shaped marks.

The second illumination section 81 has a light source which radiates a coherent light (coherent light beam) CH such as a semiconductor laser or the like. The coherent light CH from the second illumination section 81 is radiated, for example, onto third alignment marks AM3 shown in FIG. 5B. The third alignment mark AM3 is a mark including two arrays of grating-shaped marks in which linear marks AM3*a*, AM3*b* are arranged at predetermined pitches in the X direction respectively. The third alignment marks AM3 are formed, as a pattern having concave/convex portions, by pressing the lengthy substrate FB with the stamper provided on the imprint roller 11 as described above. Therefore, by radiating the coherent light CH onto the third alignment mark AM3, 0-order light (O-order diffracted light, namely, transmitted light), +1-order diffracted light and −1-order diffracted light (they are appropriately referred to as "±1-order light"), and 2-order and higher-order diffracted light are generated from the third alignment mark AM3. The second illumination section 81 is not limited to the light source which radiates the coherent light CH. The second illumination section 81 may have a light source which can be approximately regarded as a point light source, and an illumination light, which is emitted from this light source, may be radiated onto the third alignment marks AM3.

The light shielding plate 83 is a member which shields the 0-order light and the higher-order diffracted light of the coherent light CH from the third alignment mark AM3. The light shielding plate 83 is formed, for example, by plating a quartz glass plate with chromium. A chromium plating, which shields the 0-order light and the higher-order diffracted light, may be applied, for example, to a central portion and a circumferential edge portion of the light-collecting lens section 85, instead of using the light shielding plate 83. The light-collecting lens section 85 collects or focuses the ±1-order light from the third alignment mark AM3 onto the reference grating plate 87. Specifically, the light-collecting lens section 85 collects or focuses the ±1-order light generated by the plurality of linear marks AM3*a* and the ±1-order light generated by the plurality of linear marks AM3*b* as the grating-shaped marks included in the first detection area DA1 and the ±1-order light generated by the plurality of linear marks AM3*a* and the ±1-order light generated by the plurality of linear marks AM3*b* as the grating-shaped marks included in the second detection area DA2, onto the corresponding areas of the reference grating plate 87 respectively.

Figure 5C:
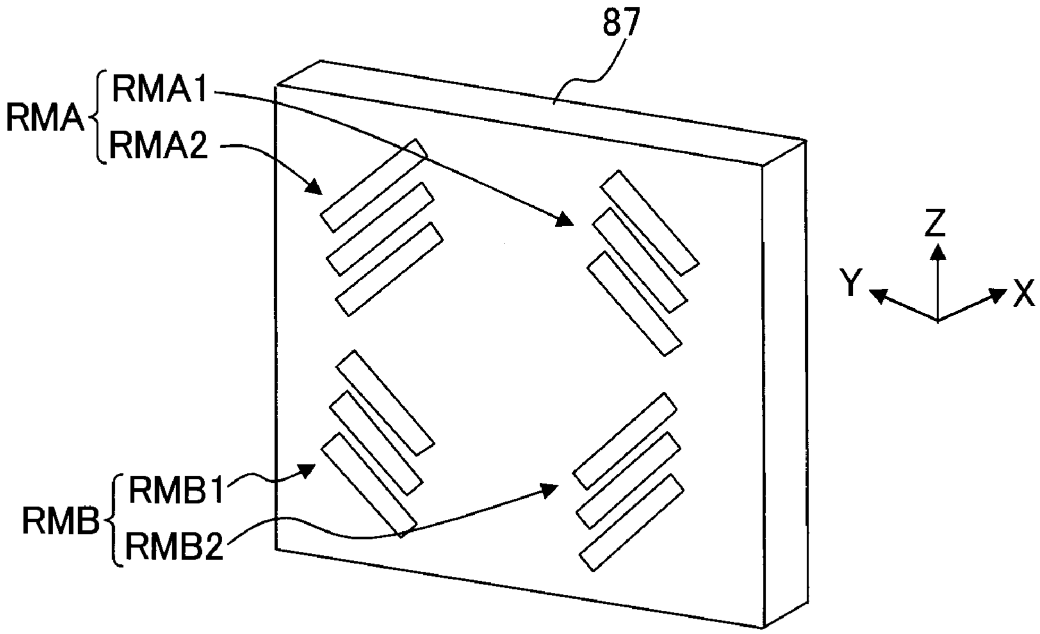
FIG. 5C shows an example of an image photographed by a second light-receiving section 88 of the second optical detector 80.

As shown in FIG. 5C, the reference grating plate 87 has reference gratings RMA1, RMA2, RMB1, RMB2 each of which is formed of a plurality of linear marks inclined by 45 degrees with respect to the transport direction (Z axis direction) respectively. A reference grating pair RMA, which includes the reference gratings RMA1, RMA2, corresponds to the third alignment mark AM3 on the outbound route disposed in the first detection area DA1, and a reference grating pair RMB, which includes the reference gratings RMB1, RMB2, corresponds to the third alignment mark AM3 on the inbound route disposed in the second detection area DA2. The respective ±1-order lights or ±1-order light beams, which are collected by the light-collecting lens section 85, are irradiated onto the corresponding reference gratings RMA1, RMA2, RMB1, RMB2 of the reference grating plate 87 respectively. Specifically, the ±1-order light from the linear mark AM3*a* on the outbound route is irradiated onto the reference grating RMA1, the ±1-order light from the linear mark AM3*b* on the outbound route is irradiated onto the reference grating RMA2, the ±1-order light from the linear mark AM3*a* on the inbound route is irradiated onto the reference grating RMB1, and the ±1-order light from the linear mark AM3*b* on the inbound route is irradiated onto the reference grating RMB2. A part of the irradiated ±1-order diffracted light and a part of the irradiated −1-order diffracted light are emitted coaxially and allowed to interfere in relation to each of the reference gratings RMA1, RMA2, RMB1, RMB2.

The arrangement interval (pitch) in the transport direction of the linear marks of each of the reference gratings RMA1, RMA2, RMB1, RMB2 is set based on the arrangement interval (pitch) in the transport direction of the linear marks AM3*a*, AM3*b* of the third alignment mark AM3 and the light-collecting magnification (focusing or imaging magnification) of the light-collecting lens section 85.

The second light-receiving section 88 includes four photodiodes in total, i.e., two photodiodes which are arranged for the reference gratings RMA1, RMA2 and two photodiodes which are arranged for the reference gratings RMB1, RMB2. Each of the photodiodes is formed to have such a size that the two light fluxes (interference light or interference light beams), which are generated coaxially from each of the reference gratings RMA1, RMA2, RMB1, RMB2, are allowed to come thereinto. An interference signal, which corresponds to the interference intensity of the two coaxially generated light fluxes, is outputted to a signal processing section 89 by each of the photodiodes of the second light-receiving section 88.

Figure 6:
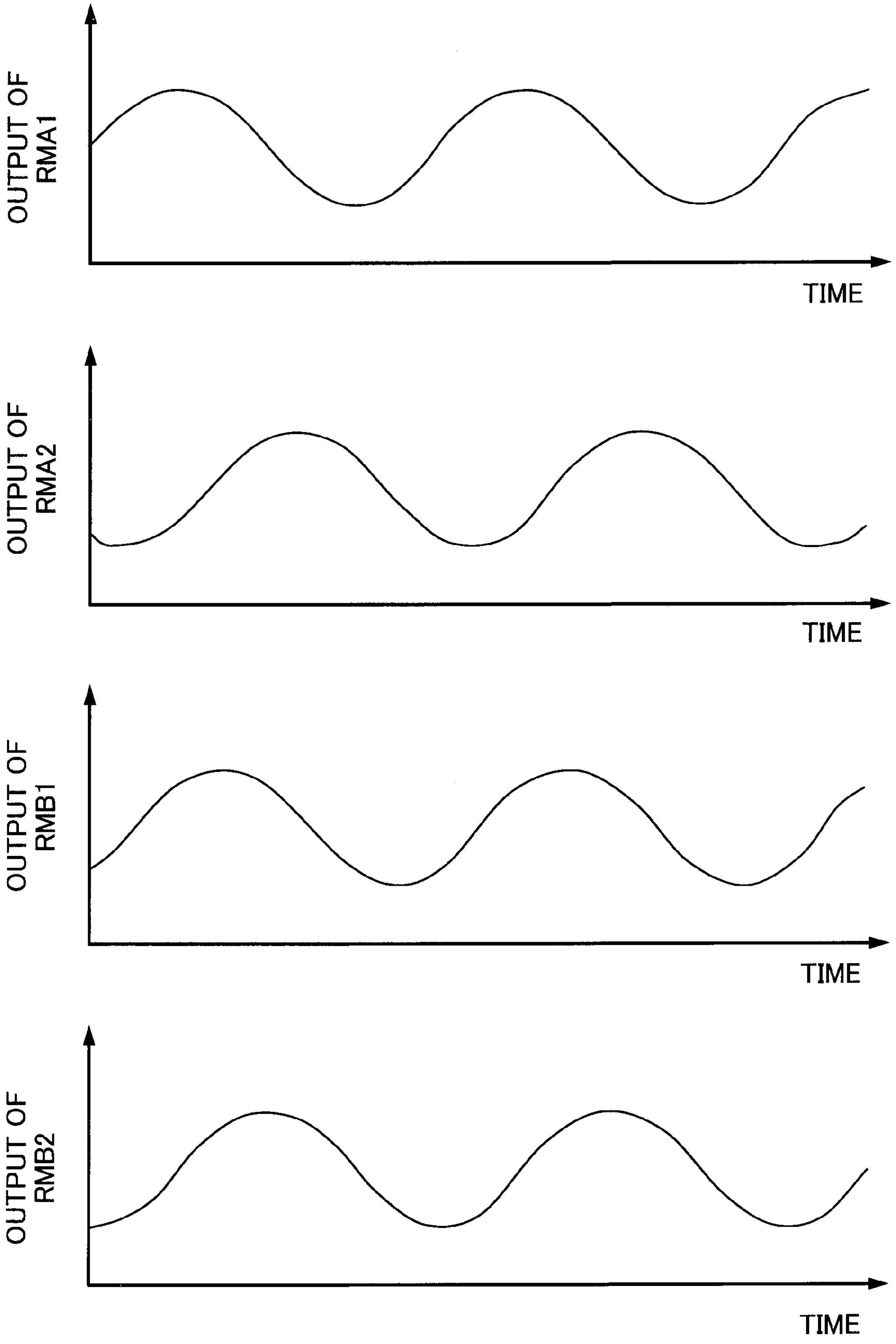
FIG. 6 shows examples to illustrate signal outputs from respective reference gratings.

FIG. 6 shows examples illustrating the interference signals corresponding to the respective reference gratings RMA1, RMA2, RMB1, RMB2. The lengthy substrate FB is transported at the constant velocity. Therefore, as shown in FIG. 6, each of the interference signals is a sine wave signal with respect to the temporal axis. For example, the signal processing section 89 calculates the position information in the transport direction of the third alignment mark AM3 disposed in the first detection area DA1 based on the phase sum of the respective interference signals corresponding to the reference gratings RMA1, RMA2, and the signal processing section 89 calculates the position information in the transport direction of the third alignment mark AM3 disposed in the second detection area DA2 based on the phase sum of the respective interference signals corresponding to the reference gratings RMB1, RMB2. Then, the signal processing section 89 derives the expansion/contraction information with respect to the reference length of the transport direction of the lengthy substrate FB based on the position information in the transport direction of the respective third alignment marks disposed in the first detection area DA1 and the second detection area DA2.

For example, the signal processing section 89 calculates the position information in the Y direction of the third alignment mark AM3 disposed in the first detection area DA1 based on the phase difference between the respective interference signals corresponding to the reference gratings RMA1, RMA2, and the signal processing section 89 calculates the position information in the Y direction of the third alignment mark AM3 disposed in the second detection area DA2 based on the phase difference between the respective interference signals corresponding to the reference gratings RMB1, RMB2. Then, the signal processing section 89 derives the information about the relative deviation in the Y direction between the lengthy substrate FB on the outbound route and the lengthy substrate FB on the inbound route based on the position information in the Y direction of the respective third alignment marks disposed in the first detection area DA1 and the second detection area DA2.

In the second optical detector 80, the first detection area DA1 and the second detection area DA2 are defined by using the second illumination section 81, the light-collecting lens section 85, and the reference grating plate 87.

Another Modification of Optical Detector

Figure 7:
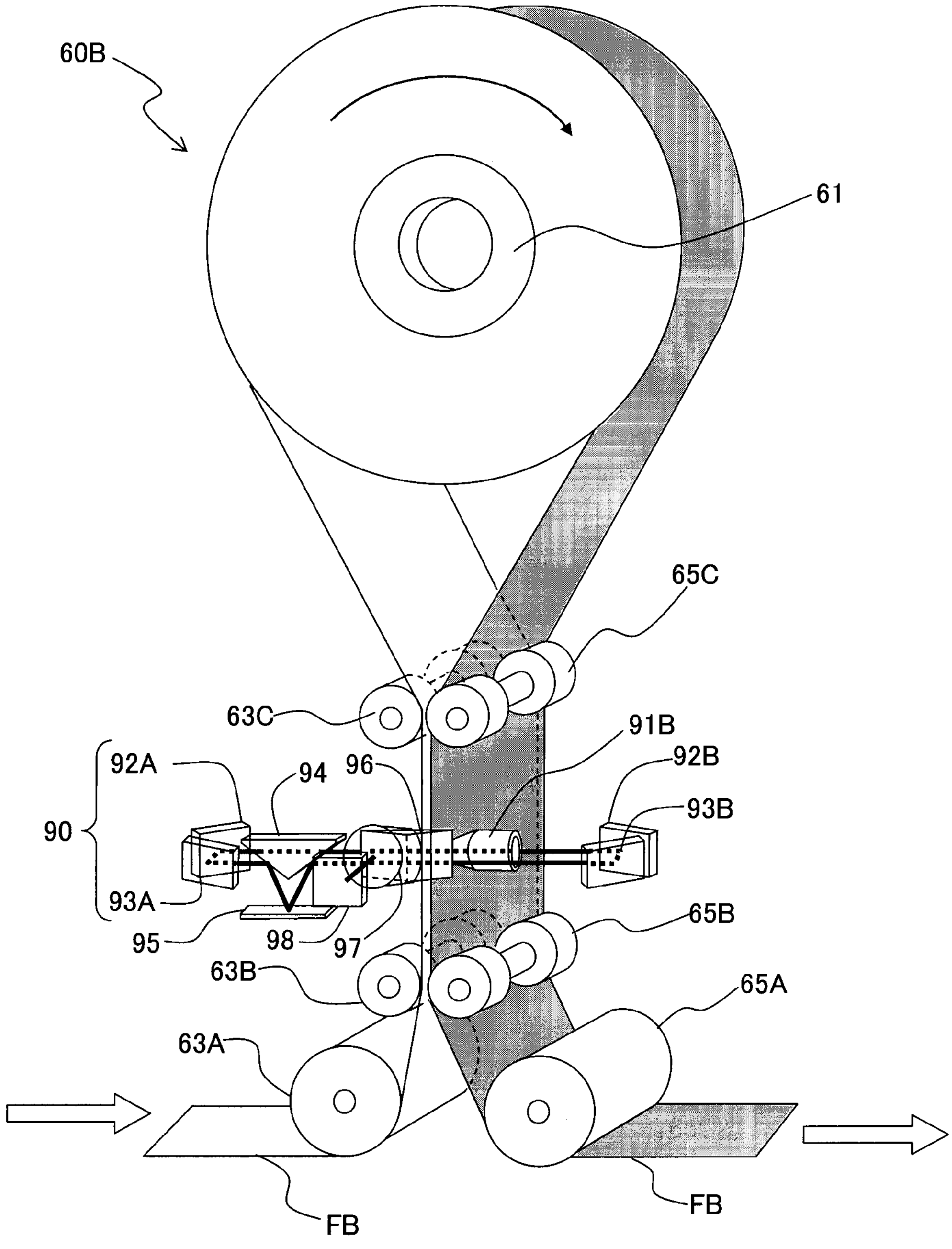
FIG. 7 shows a schematic perspective view of a position-detecting device 60B using a third optical detector 90.
Figure 8B:
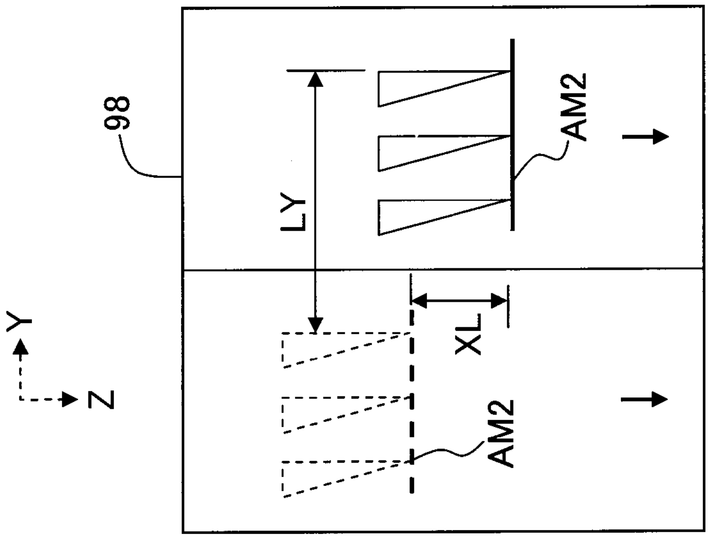
FIG. 8B shows an example of an image photographed by a third light-receiving section 98 of the third optical detector 90.
Figure 8A:
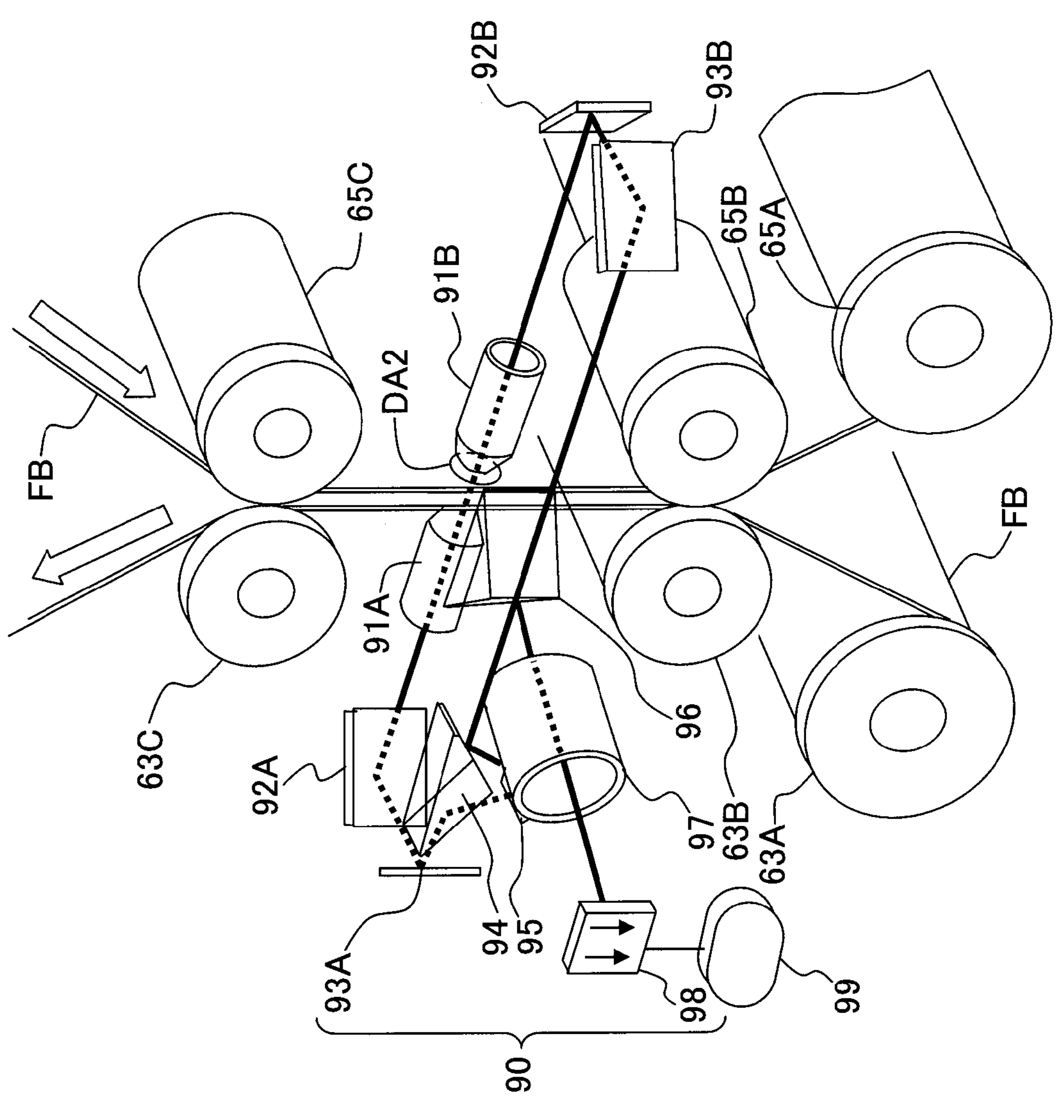
FIG. 8A shows a magnified perspective view of the third optical detector 90.

FIG. 7 shows a schematic perspective view of the construction of a position-detecting device 60B using a third optical detector 90. FIG. 8A shows a magnified perspective view of the third optical detector 90. FIG. 8B shows an example of an image photographed (imaged) by a third light-receiving section 98 of the third optical detector 90.

The third optical detector 90 shown in FIGS. 7 and 8A defines the first detection area DA1 (not shown) and the second detection area DA2 (see FIG. 8A). The third optical detector 90 has an image inverting section including an outbound route objective lens 91A, outbound route reflecting mirrors 92A, 93A, a reflecting prism 94, and a reflecting mirror 95. The third optical detector 90 has an inbound route objective lens 91B and inbound route reflecting mirrors 92B, 93B. Further, the third optical detector 90 has a reflecting prism 96, an imaging lens section 97, and a third light-receiving section 98. The third optical detector 90 images or photographs the alignment mark AM disposed in the first detection area DA1 by the light-receiving section 98 via the outbound route objective lens 91A, the outbound route reflecting mirrors 92A, 93A, the image inverting section, the reflecting prism 96, and the imaging lens section 97. The third optical detector 90 images or photographs the alignment mark AM disposed in the second detection area DA2 by the light-receiving section 98 via the inbound route objective lens 91B, the inbound route reflecting mirrors 92B, 93B, the reflecting prism 96, and the imaging lens section 97. That is, in the third optical detector 90, the respective observation images of the alignment marks AM, which are obtained via the outbound route objective lens 91A and the inbound route objective lens 91B respectively, are allowed to exist adjacently by the reflecting prism 96, thereby making it possible to image (photograph) adjacent respective observation images by the light-receiving section 98 collectively or integrally.

The third light-receiving section 98 is constructed of, for example, a CCD sensor or a CMOS sensor. The illumination section, which illuminates the alignment marks, is not depicted in FIGS. 7 and 8. However, an epi-illumination device, etc. may be arranged between the imaging lens section 97 and the third light-receiving section 98 to illuminate the alignment marks. It is preferable that the illumination section is capable of performing the short period illumination in the same manner as the illumination section 71.

The third optical detector 90 detects (photographs or images), for example, the second alignment marks AM2 shown in FIG. 4.

The third light-receiving section 98 outputs the image information of the photographed second alignment marks AM2 to a third image processing section 99. The third image processing section 99 derives the information about the expansion/contraction of the lengthy substrate FB with respect to the reference length in the transport direction and the information about the deviation of the lengthy substrate FB in the Y direction in the same manner as the image processing section 79.

FIG. 8B shows an example of an image of a case in which the third light-receiving section 98 simultaneously photographs or images the second alignment mark AM2 on the outbound route disposed in the first detection area DA1 and the second alignment mark AM2 on the inbound route disposed in the second detection area DA2, wherein the second alignment mark AM2 on the outbound route is depicted by dotted lines, and the second alignment mark AM2 on the inbound route is depicted by solid lines. In this case, the second alignment mark AM2 on the outbound route and the second alignment mark AM2 on the inbound route are moved in the mutually opposite directions in accordance with the transport of the lengthy substrate FB. However, the image of the second alignment mark AM2 on the outbound route and the image of the second alignment mark AM2 on the inbound route are inverted upside down relative to the common third light-receiving section 98 owing to the action of the image inverting section constructed of the reflecting prism 94 and the reflecting mirror 95. Therefore, the images of the second alignment marks AM2 on the outbound route and the inbound route, which exist on the image photographed (imaged) by the third light-receiving section 98, are mutually moved in the same direction. This reduces the measurement error caused by the deviation of the timing of the short period illumination (strobe light emission) for illuminating the second alignment mark AM2, i.e., the measurement error of, for example, the expansion/contraction information caused by the deviation of the timing for photographing the second alignment mark AM2.

As shown in FIG. 8B, the second alignment mark AM2 (linear mark AM2*a*) on the outbound route and the second alignment mark AM2 (linear mark AM2*a*) on the inbound route are deviated from each other by the distance XL in the transport direction, and the second alignment mark AM2 (triangular mark AM2*b*) on the outbound route and the second alignment mark AM2 (triangular mark AM2*b*) on the inbound route are deviated from each other by the distance YL in the Y direction. The third image processing section 99 derives the information about the expansion/contraction of the lengthy substrate FB with respect to the reference length in the transport direction based on the second alignment marks AM2 separated from each other by the distance XL, and the third image processing section 99 derives the information about the relative deviation of the lengthy substrate FB in the Y direction based on the second alignment marks AM2 separated from each other by the distance YL in the same manner as the image processing section 79.

The third optical detector 90 described above is constructed such that the observation optical axes, which are provided by the outbound route objective lens 91A and the inbound route objective lens 91B, are coaxially combined. However, the respective observation optical axes may be separated from each other by a predetermined amount in the X direction. The foregoing third optical detector 90 has been explained assuming that the second alignment marks AM2 are detected. However, the first alignment marks AM1, etc. may be detected without being limited to the second alignment marks AM2.

In this modification, since the alignment marks are detected in the first and second detection areas DA1 and DA2 with the lights from the separate illumination systems, respectively, there is no need to cause the light transmit through the lengthy substrate FB. Therefore, the third optical detector 90 of this modification can be applied to a lengthy substrate 90 formed of a material which does not transmit light.

As explained above, the optical detector has been exemplified by the three different kinds of the optical detectors. These optical detectors have the following common advantages. In the production apparatus 100, the lengthy substrate FB is deformed or expanded/contracted due to, for example, the liquid droplet jetted from the liquid droplet coating device 21 and collided on the lengthy substrate FB, the heat applied from the cutting device 31 and/or the heat treatment device BK and/or the tension applied from the main drum 61 to the lengthy substrate FB, in some cases. In each of the optical detectors of the embodiment, the first detection area DA1 and the second detection area DA2 are arranged, for example, in the sub transport route TGT in the gate electrode forming section GT at positions such that the liquid droplet coating device 21 and the heat treatment device BK are intervened between the first and second detection areas DA1 and DA2. Further, the first detection area DA1 and the second detection area DA2 are arranged in the sub transport route TGT at positions such that an area of the main drum 61, to or along which the lengthy substrate FB is allowed to hang on or travel, namely the area of the lengthy substrate FB to which the tension is applied, is intervened between the first and second detection areas DA1 and DA2. With this, it is possible to effectively detect the expansion/contraction and/or the deformation of the lengthy substrate FB which would be caused by the collision of the liquid droplet onto the lengthy substrate FB, the heat applied from the heat treatment device BK to the lengthy substrate FB and/or the tension applied from the main drum 61 to the lengthy substrate FB. Further, by arranging such an optical detector in each of the gate electrode forming section GT, the insulating layer forming section IS, the source/drain electrode forming section SD, the channel length forming section CL, and the organic semiconductor forming section OS, it is possible to analyze the amount of expansion/contraction of the lengthy substrate FB in each of these forming sections to thereby appropriately adjust the tension and/or the force applied to the lengthy substrate FB in each of the forming sections.

Figure 9:
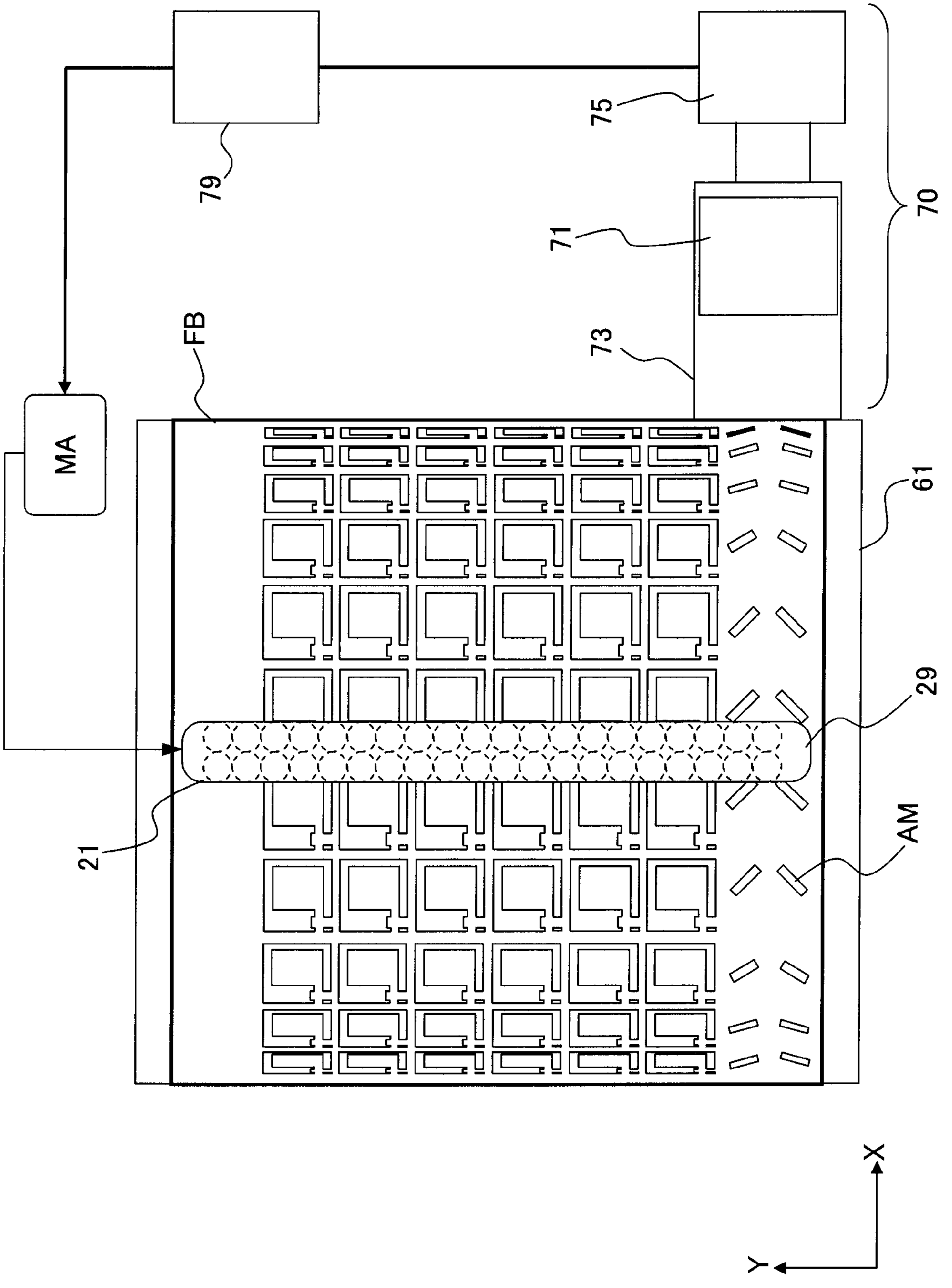
FIG. 9 shows a plan view of a main drum 61 and a liquid droplet coating device 21 as seen in the Z direction.

Construction of Liquid Droplet Coating Device 21 and Correction of Position in Coating FIG. 9 shows a plan view of the liquid droplet coating device 21 shown in FIG. 2 and the lengthy substrate FB allowed to hang on or travel along the main drum 61 as seen in the Z axis direction. The first alignment marks AM1 shown in FIG. 3A are formed on the lengthy substrate FB shown in FIG. 9. FIG. 9 is illustrative of an exemplary case in which the first alignment marks AM1 are detected by the first optical detector 70. However, it is also allowable to use the second optical detector 80 shown in FIG. 5 and the third optical detector 90 shown in FIG. 7.

The liquid droplet coating device 21 has such a structure that the liquid droplet coating device 21 extends in the Y direction. A plurality of nozzles 29 are arranged in rows in the Y direction, and several rows of nozzles 29 are arranged in the X direction as well. The liquid droplet coating device 21 is capable of switching at least one of the timing at which the metal ink is applied from the nozzle 29 and the nozzle 29 from which the metal ink is applied in accordance with the position signal from the main controller MA.

The main controller MA stores reference coating position information for coating the metal ink on the lengthy substrate FB by the liquid droplet coating device 21. The reference coating position information is a coating position information in a state that the expansion/contraction, the inclination and the like of the lengthy substrate FB are absent. The main controller MA corrects the reference coating position information based on the expansion/contraction information or the deviation information of the lengthy substrate FB supplied from the image processing section 79. The main controller MA can also correct the reference coating position information based on the velocity of rotation of the main drum 61 or the velocity information of the lengthy substrate FB derived by the image processing section 79.

The liquid droplet coating device 21 receives the corrected reference coating position information from the main controller MA to judge from which nozzle 29, of the plurality of nozzles 29, the metal ink is to be applied and at which timing the metal ink is to be applied. With this, the metal ink is applied from the nozzle 29. Therefore, the processing can be performed for the lengthy substrate FB even if the tension roller 67 shown in FIG. 2 is not provided. As described above, it is allowable that the coating position by the liquid droplet coating device 21 is not corrected in a case that the length of the lengthy substrate FB can be corrected by moving the tension roller 67, or moving the third outbound route subsidiary drum 63C or the third inbound route subsidiary drum 65C instead of the tension roller 67, in the X direction so as to apply the tensile stress to the lengthy substrate FB, or in a case that the inclination of the lengthy substrate FB can be corrected by moving the third inbound route subsidiary drum 65C in the Y direction.

FIG. 9 is illustrative of the exemplary case that the first alignment marks AM1 are formed only on one side of the lengthy substrate FB. However, in a case that the first alignment marks AM1 are formed on the both sides, the first optical detectors 70 may be arranged on the both sides. Further, when any space is present on the lengthy substrate FB, the first alignment marks AM1 may be provided in a central area of the lengthy substrate FB.

Figure 10:
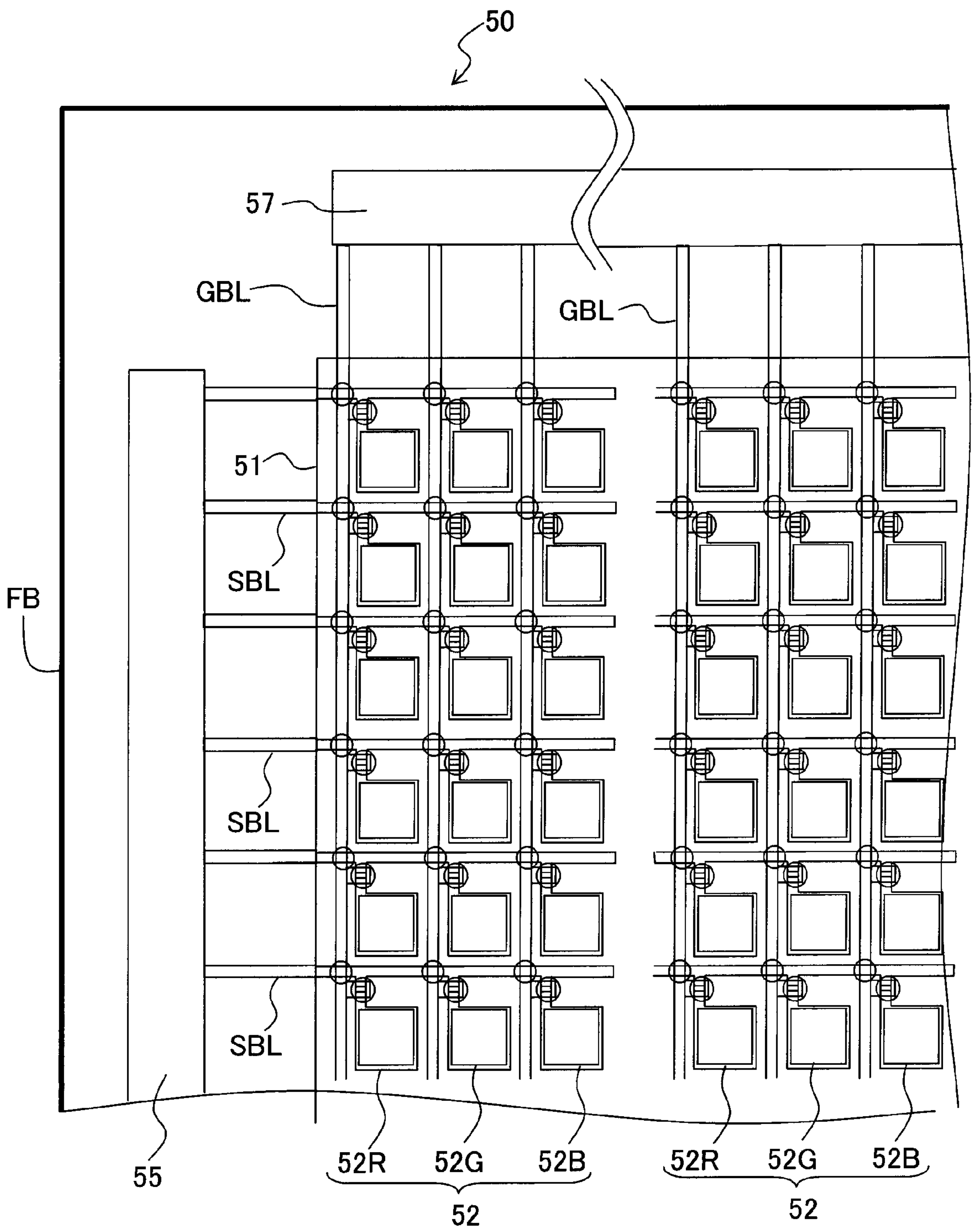
FIG. 10 shows a plan view illustrating a schematic planar circuit arrangement of an organic EL display device 50 formed on the lengthy substrate FB by using a production apparatus of an embodiment of the invention.
Figure 11:
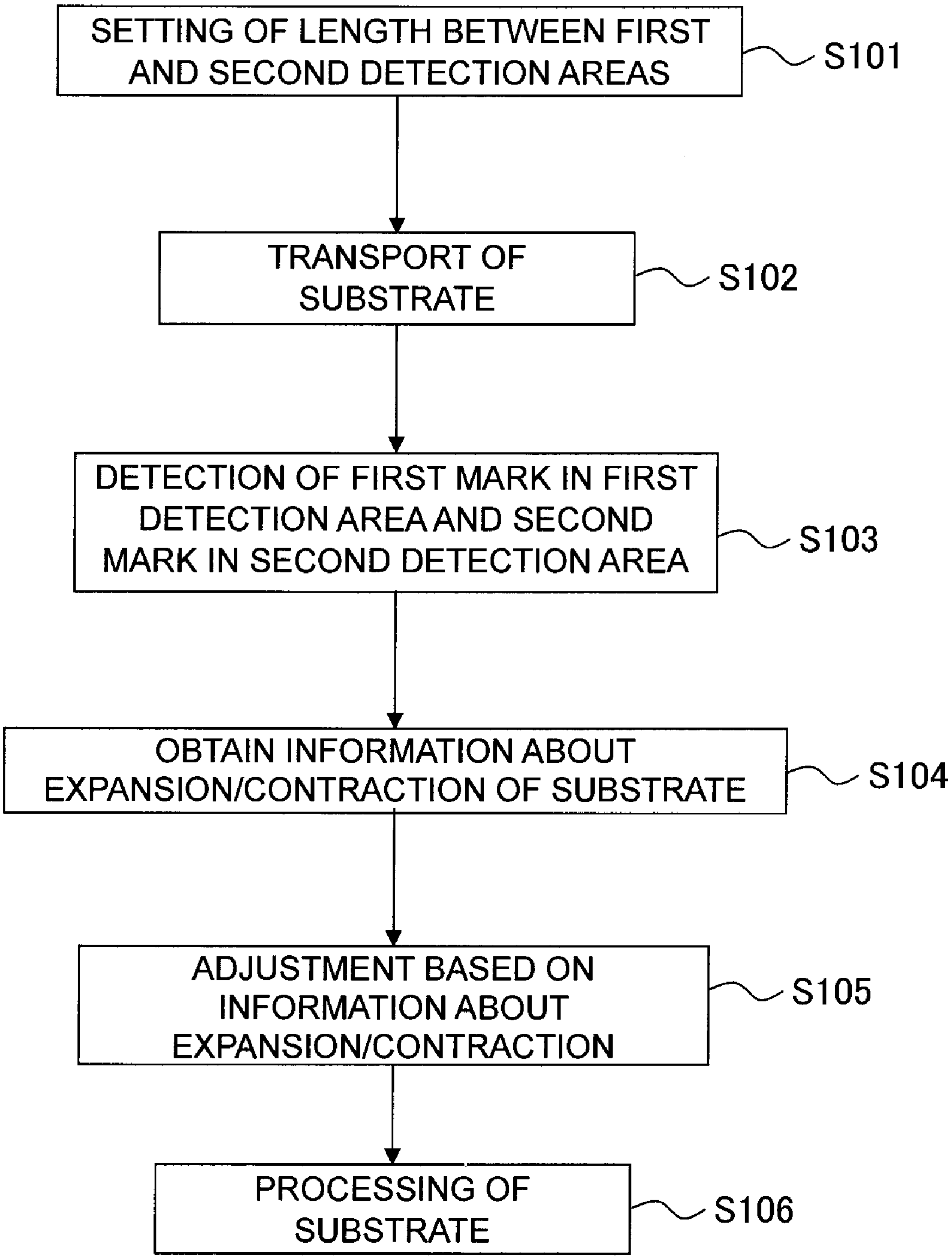
FIG. 11 is a flow chart showing an outline of a method for measuring an expansion/contraction of the substrate, included in a production process of thin film transistor.

Although the production process of the thin film transistor by the production apparatus 100 has been explained with the embodiment, by way of example, in relation to FIGS. 1 to 10, the outline of the method for measuring expansion/contraction of the substrate, which is included in the production process of thin film transistor, is shown in a flow chart of FIG. 11. In this flow chart, as described above, the position-detecting device is provided on each of the gate electrode forming section GT, the insulating layer forming section IS, the source/drain electrode forming section SD, the channel length forming section CL, and the organic semiconductor forming section OS which construct the electrode forming section. At this time, the length (reference length), which is provided in the transport direction of the lengthy substrate FB between the first detection area DA1 and the second detection area DA2, is set as in the embodiment described above (S101). Afterwards, the lengthy substrate FB is transported on the transport route T and made to pass, for example, through the first detection area DA1 and the second detection area DA2 in the gate electrode forming section GT (S102). Then, the first and second marks formed on the lengthy substrate FB are detected in the first and second detection areas DA1, DA2, respectively (S103). The change amount between the first and second detection areas DA1 and DA2, and consequently the expansion/contraction amount (information about expansion/contraction) of the lengthy substrate FB is obtained based on positional information about the detected first and second marks (S104). Subsequently, as necessary, the length of the lengthy substrate FB and/or the information about the coating position are/is corrected based on the obtained expansion/contraction amount (S105). Then, processes such as the coating of the liquid droplet and the baking are performed for the lengthy substrate (S106). Such steps are performed in each of the gate electrode forming section GT, the insulating layer forming section IS, the source/drain electrode forming section SD, the channel length forming section CL, and the organic semiconductor forming section OS. However, it is not necessarily indispensable that these steps are performed in all of the forming sections, and it is allowable that the steps are performed only in one of the forming sections, as necessary. In this way, the thin film transistor is formed on the lengthy substrate FB.

Structure of Organic EL Display Device 50

Figure 12:
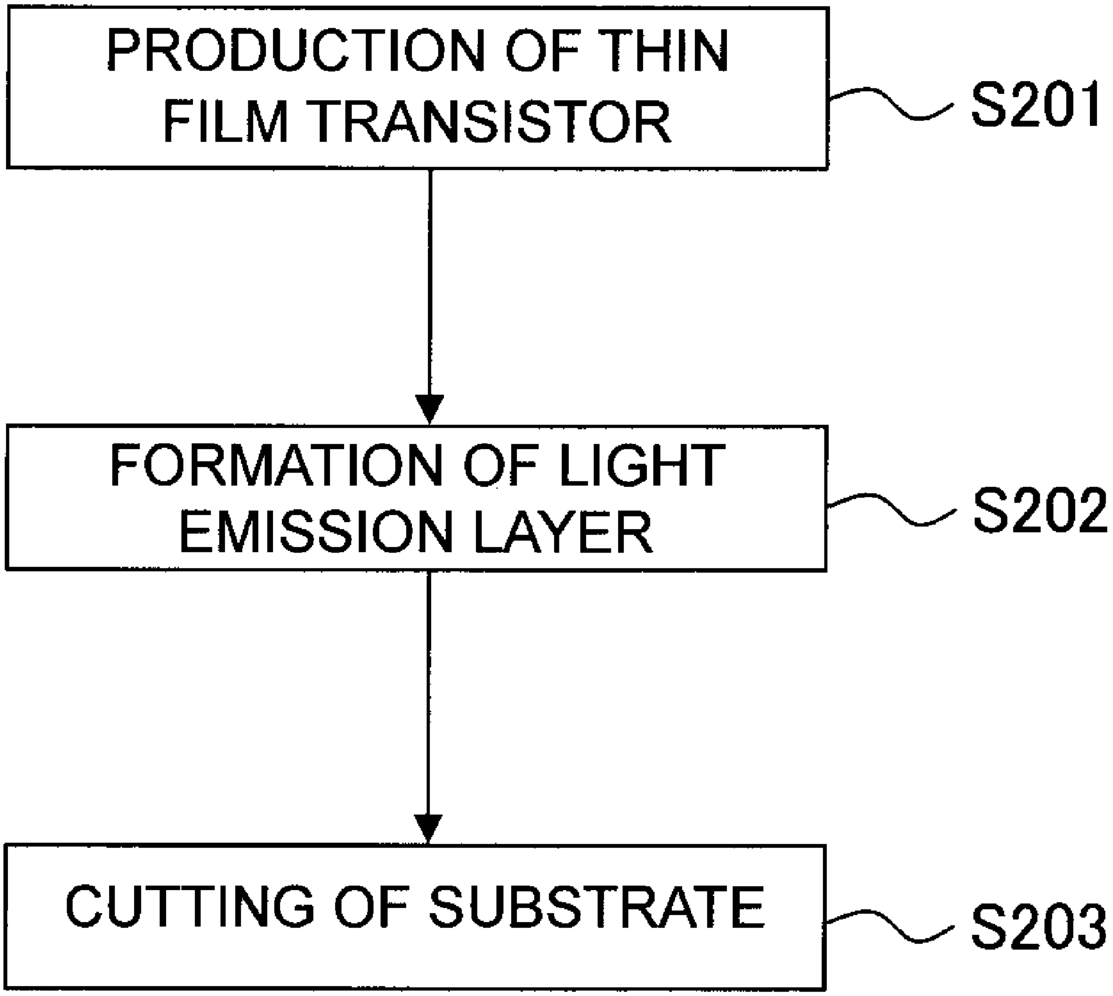
FIG. 12 is a flow chart showing an outline of a method for producing an organic EL display device.

FIG. 10 shows a plan view of a schematic planar circuit arrangement of an organic EL display device 50 formed on the lengthy substrate FB by using the production apparatus 100 of this embodiment. The organic EL display device 50 is produced, as shown in a flow chart of FIG. 12, by performing the production steps of producing the thin film transistors in the production apparatus 100 (S201) and performing, for example, production steps of producing an unillustrated light emission layer of the organic EL display device (S202) to carry out the processing. After that, the lengthy substrate FB is cut to produce the organic EL display device 50 (S203).

The organic EL display device 50 is provided with a rectangular display area 51 disposed at a substantially central portion thereof. Pixels 52 are formed in a matrix form in the display area 51. A signal line driving circuit 55 and a scanning driving circuit 57 are provided at outer circumferential portions of the pixels 52 arranged in the matrix form.

The display area 51 includes n pieces of pixels 52 per one row, and m pieces of rows of the pixels 52 are formed in the display area 51. In this structure, the constitutive section is one pixel including a light emission pixel 52R for red for emitting the red light, a light emission pixel 52G for green for emitting the green light, and a light emission pixel 52B for blue for emitting the blue light. Source bus lines SBL are connected to the signal line driving circuit 55. The source bus lines SBL are wired to the individual light emission pixels 52R, 52G, 52B. Gate bus lines GBL are connected to the scanning driving circuit 57. The gate bus lines GBL are wired to the individual light emission pixels 52R, 52G, 52B. Further, an unillustrated common electrode, etc. is also wired to the individual light emission pixels 52R, 52G, 52B.

A signal, which is supplied to the gate bus lines GBL of the scanning driving circuit 57, is received by the individual light emission pixels 52R, 52G, 52B, and the voltage, which is supplied from the source bus lines SBL of the signal line driving circuit 55, is applied to the individual light emission pixels 52R, 52G, 52B. With this, the individual light emission pixels 52R, 52G, 52B perform the light emission.

The best mode for carrying out the present invention has been explained above. However, the present invention is not limited to the embodiments described above, and may be variously modified within a range without deviating from the gist or essential characteristics of the present invention.

For example, FIG. 1 shows the processing devices or apparatuses including the liquid droplet coating device 21, the cutting device 31, etc. However, it is also allowable to arrange a printing roller for printing the metal ink or an exposure apparatus for exposing the lengthy substrate FB. Further, the alignment mark AM is not limited to the first alignment mark AM1, the second alignment mark AM2, and the third alignment mark AM3. It is also possible to use any alignment mark having any shape other than the above.

In each of the position-detecting devices 60, 60A, 60B, the lengthy substrate FB is allowed to hang on or travel along the main drum 61 so that the lengthy substrate FB is folded back, wherein the pre-folding portion of the lengthy substrate FB disposed on the outbound route side and the post-folding portion of the lengthy substrate FB disposed on the inbound route side are arranged closely and in parallel to each other.

However, the present invention is not limited to the close and parallel arrangement or structure. For example, the transport directions for the pre-folding portion and the post-folding portion may be mutually inclined by predetermined angles in the XZ plane. In this case, for example, the respective alignment marks AM, which are disposed in the first detection area DA1 and the second detection area DA2, may be detected (photographed or imaged) by using individual objective lenses and light-receiving sections. Also in the position-detecting devices 60, 60A, 60B described above, the respective alignment marks AM, which are disposed in the first detection area DA1 and the second detection area DA2, may be detected by using individual light-receiving sections.

In the position-detecting devices 60, 60A, 60B, the respective alignment marks AM, which are disposed in the first detection area DA1 and the second detection area DA2, are simultaneously detected. However, the present invention is not limited to the simultaneous detection. The detection may be successively performed at predetermined intervals (terms or periods). In the position-detecting devices 60, 60A, 60B, the reference length of the lengthy substrate FB, which is taken in the transport direction from the first detection area DA1 to the second detection area DA2, is the integral multiple of the arrangement interval (pitch) of the alignment marks AM. However, it is also possible to set the reference length to a length different from the integral multiple. In this case, at least one of the first detection area DA1 and the second detection area DA2 may be expanded to simultaneously detect the respective alignment marks AM corresponding to the first and second detection areas. Alternatively, the respective alignment marks corresponding to the first and second detection areas may be non-simultaneously detected at predetermined intervals.

In the position-detecting devices 60, 60A, 60B, the lengthy substrate FB is allowed to hang on or travel along one main drum 61 so that the lengthy substrate FB is folded back. However, the lengthy substrate FB may be also allowed to hang on or travel along a plurality of drums, etc. so that the lengthy substrate FB is folded back (the transport direction is deflected). In the position-detecting devices 60, 60A, 60B, the main drum 61 (or the central axis thereof) is provided at the substantially equal distances from the first detection area DA1 and the second detection area DA2. However, the present invention is not limited to the equal distance. The setting may be also made at different distances from the respective detection areas.

Although the illumination section 71, the objective lens section 73, and the light-receiving section (image pickup section) 75 are integrally provided on the first optical detector 70, it is allowable that the illumination section 71, the objective lens section 73, and the light-receiving section 75 are provided separately. As the illumination section 71, it is possible to use an illumination system which is usable in the environment in which the optical detector 70 and/or the production apparatus 100 are used; and it is not necessary that the optical detector 70 and/or the production apparatus 100 are/is provided with the illumination section 71. This is similarly applied also to the illumination section 81 provided on the second detector 80, and it is not necessary that the optical detector 80 and/or the production apparatus 100 are/is provided with the illumination section 81.

Although the explanation for the light-emitting layer forming section is omitted in the production process of the thin film transistor, it is possible to provide a position-detecting device, which is similar to that provided on the electrode forming section, also on the light-emitting layer forming section.

In the embodiment, the pre-folding portion and the post-folding portion, by the main drum 61, of the lengthy substrate FB are arranged to be parallel to and closely to each other. However, when it is possible to detect the alignment marks AM in the pre-folding portion and the post-folding portions respectively, there is no need to arrange the pre-folding portion and the post-folding portions parallel to each other.

In the embodiment, although the method for producing the organic EL display device 50 using the lengthy substrate FB has been explained by way of example, the present invention is applicable to a various types of products and methods for producing the various types of products. For example, the present invention is applicable to a case of forming, with a lengthy sheet (substrate), a flexible cable or circuit board on which the driving circuits of the various types of devices, etc. are mounted. Further, the lengthy substrate FB is not limited to those having sheet-shaped, and may be members having various shapes. Furthermore, the processing apparatus (processing device) is not limited to the liquid droplet coating device (liquid-droplet jetting device) and/or the heat treatment device, etc. exemplified in the embodiment; and the processing apparatus may be a processing apparatus which affects the expansion/contraction of a lengthy substrate and which includes a various types of devices such as a radiating device of particle beam such as electron beam, a device for depositing a compound and/or metal, a device for jetting molten metal such as solder or molten resin, etc. The field to which the present invention is applicable is also not limited to the field of the device production such as electronic parts and semiconductors. The measuring apparatus and the measuring method of the present invention is applicable also to a field which is different from the device production field and which includes the field of textile, food processing, etc.

With the present invention, it is possible to obtain the expansion/contraction information of a substrate, which has expandability/contractibility, highly precisely. Accordingly, the present invention is quite useful in the production of various devices, such as organic EL display device, using a sheet-shaped member which has expandability/contractibility.

What is claimed is:

1. An expansion/contraction measuring method comprising:

transporting an expandable/contractible substrate along a surface of the substrate;

detecting first and second marks which are formed on the substrate while being separated from each other by a predetermined spacing distance in a transport direction of the substrate and which are moved, in accordance with the transport of the substrate, to first and second detection areas disposed on a transport route for the substrate respectively;

setting a length of the substrate along the transport route between the first and second detection areas to a reference length; and deriving information about expansion/contraction of the substrate in relation to the transport direction based on a detection result of the first and second marks, wherein the substrate is transported while being hung on a support member and folded back;

the first detection area and the second detection area are arranged opposite to each other, the first detection area being disposed on an upstream side in the transport direction from a folding portion, of the substrate, at which the substrate is folded back by the support member, the second detection area being disposed on a downstream side of the folding portion.

2. The expansion/contraction measuring method according to claim 1, wherein the setting to the reference length comprises allowing the substrate, which is transported along the transport route between the first and second detection areas, to hang on the support member provided to be separated, by predetermined distances, from the first and second detection areas.

3. The expansion/contraction measuring method according to claim 2, wherein the setting to the reference length comprises allowing the substrate, which is transported along the transport route between the first and second detection areas, to hang on the support member and folding back the substrate.

4. The expansion/contraction measuring method according to claim 3, wherein the setting to the reference length comprises closely arranging a post-folding portion, of the substrate, disposed on the downstream side in the transport direction from the folding portion and a pre-folding portion, of the substrate, disposed on the upstream side of the folding portion; and the first detection area and the second detection area are set corresponding to the pre-folding portion and the post-folding portion respectively which are arranged closely to each other.

5. The expansion/contraction measuring method according to claim 2, wherein the support member is arranged to be separated, by substantially equal distances, from the first and second detection areas.

6. The expansion/contraction measuring method according to claim 1, wherein the reference length is substantially equal to a length which is an integral multiple of the predetermined spacing distance.

7. The expansion/contraction measuring method according to claim 1, wherein the support member is a rotatable member which is rotatable about a predetermined axis perpendicular to the transport direction;

the setting to the reference length comprises allowing the substrate, which is transported along the transport route between the first and second detection areas, to hang on an outer circumferential surface of the rotatable member; and the reference length is equal to an integral multiple of a length of the outer circumferential surface about the predetermined axis.

8. The expansion/contraction measuring method according to claim 1, wherein the detection of the first and second marks comprises detecting position information about each of the first and second marks; and the deriving of the expansion/contraction information comprises deriving the expansion/contraction information based on the position information about each of the first and second marks.

9. The expansion/contraction measuring method according to claim 1, wherein the detection of the first and second marks comprises detecting a positional relationship between the first mark and the second mark based on an image photographed by illuminating the first mark and the second mark for a short period of time.

10. The expansion/contraction measuring method according to claim 9, wherein the first and second marks include marks formed so that directions of movement of the first and second marks are distinguishable.

11. The expansion/contraction measuring method according to claim 9, wherein the detection of the first and second marks comprises detecting image of the first mark and image of the second mark by a common image pickup device.

12. The expansion/contraction measuring method according to claim 11, wherein the detection of the first and second marks comprises inverting the image of the first mark and the image of the second mark relative to the common image pickup device.

13. The expansion/contraction measuring method according to claim 1, wherein the first and second marks are grating-shaped marks; and the detection of the first and second marks comprises detecting a positional relationship between the first mark and the second mark based on a first interference signal obtained by allowing a plurality of diffracted lights from the first mark to interfere and a second interference signal obtained by allowing a plurality of diffracted lights from the second mark to interfere.

14. The expansion/contraction measuring method according to claim 13, wherein the grating-shaped marks include marks in which grating elements, which are inclined with respect to the transport direction, are arranged in the transport direction.

15. A substrate processing method comprising changing a length of a substrate in the transport direction based on the expansion/contraction information derived by using the expansion/contraction measuring method as defined in claim 1; and performing a predetermined process for the substrate.

16. A substrate processing method comprising:

calculating correction information in relation to a predetermined process for a substrate based on the expansion/contraction information derived by using the expansion/contraction measuring method as defined in claim 1; and correcting information in relation to the predetermined process based on the correction information to perform the predetermined process for the substrate.

17. The substrate processing method according to claim 15, wherein the predetermined process includes a process for forming a pattern on the substrate.

18. The substrate processing method according to claim 16, wherein the predetermined process includes a process for forming a pattern on the substrate.

19. A device production method comprising:

performing a predetermined process for a substrate by using the substrate processing method as defined in claim 15; and processing the substrate, for which the predetermined process has been performed, based on a result of the predetermined process.

20. A device production method comprising:

performing a predetermined process for a substrate by using the substrate processing method as defined in claim 16; and processing the substrate, for which the predetermined process has been performed, based on a result of the predetermined process.

21. An expansion/contraction measuring method for measuring expansion/contraction of a lengthy member which is transported while being hung on a rotary drum and folded back and which is processed by a processing device arranged to be opposite to the rotary drum, the method comprising:

forming a plurality of marks on the lengthy member at a predetermined spacing distance in a longitudinal direction of the lengthy member;

detecting simultaneously a first mark provided on a feed-on portion, of the lengthy member, which is to be fed onto the rotary drum at a first detection area and a second mark provided on a feed-out portion, of the lengthy member, which is fed out of the rotary drum at a second detection area; and obtaining information about the expansion/contraction of the lengthy member from relative positions of the detected first mark and the detected second mark, wherein the first detection area is disposed on an upstream side in a transport direction of the substrate from a folding portion, of the substrate, at which the substrate is folded back by the rotary drum and the second detection area is disposed on a downstream side of the folding portion.

22. The expansion/contraction measuring method according to claim 21, wherein the feed-on portion and the feed-out portion of the lengthy member are arranged in parallel to each other.

23. The expansion/contraction measuring method according to claim 21, wherein the first and second marks are detected simultaneously on a transport route of the lengthy member at a predetermined position with respect to the rotary drum.

24. The expansion/contraction measuring method according to claim 23, wherein the predetermined position is set based on the predetermined spacing distance of the plurality of marks and a distance between the predetermined position and the rotary drum.

25. The expansion/contraction measuring method according to claim 23, wherein a light from the first mark and a light from the second mark are detected at the predetermined position.

26. The expansion/contraction measuring method according to claim 25, wherein the light from the first mark and the light from the second mark are reflected lights or diffracted lights.

27. The expansion/contraction measuring method according to claim 26, wherein the light from one of the first and second marks is detected at the predetermined position by being passed through a portion, of the lengthy member, on which the other of the first and second marks is provided.

28. The expansion/contraction measuring method according to claim 21, wherein the processing device is at least one of a liquid droplet coating device, a heat treatment device and a light irradiating device.

* * * * *